United States Patent
Nishihara et al.

(10) Patent No.: US 11,280,918 B2
(45) Date of Patent: Mar. 22, 2022

(54) IMAGING ELEMENT, DRIVING METHOD, AND ELECTRONIC DEVICE

(71) Applicant: Sony Corporation, Tokyo (JP)

(72) Inventors: Toshiyuki Nishihara, Kanagawa (JP); Kenichi Okumura, Tokyo (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 16/060,709

(22) PCT Filed: Dec. 2, 2016

(86) PCT No.: PCT/JP2016/085856
§ 371 (c)(1),
(2) Date: Jun. 8, 2018

(87) PCT Pub. No.: WO2017/104438
PCT Pub. Date: Jun. 22, 2017

(65) Prior Publication Data
US 2018/0348381 A1    Dec. 6, 2018

(30) Foreign Application Priority Data

Dec. 16, 2015 (JP) .............................. JP2015-245286

(51) Int. Cl.
*G01T 1/20* (2006.01)
*H01L 27/144* (2006.01)
(Continued)

(52) U.S. Cl.
CPC .............. *G01T 1/2006* (2013.01); *G01T 1/20* (2013.01); *H01L 27/144* (2013.01);
(Continued)

(58) Field of Classification Search
CPC .................................................... H04N 5/378
See application file for complete search history.

(56) References Cited

U.S. PATENT DOCUMENTS 9,380,245 B1 * 6/2016 Guidash ............... H04N 5/3696
2007/0176109 A1 * 8/2007 Bell ....................... G01T 1/2928
250/370.09
(Continued)

FOREIGN PATENT DOCUMENTS

CN    103875236 A    6/2014
CN    103975580 A    8/2014
(Continued)

OTHER PUBLICATIONS

International Search Report and Written Opinion dated Feb. 7, 2017, in connection with International Application No. PCT/JP2016/085856.

(Continued)

*Primary Examiner* — Rebecca A Volentine
(74) *Attorney, Agent, or Firm* — Wolf, Greenfield & Sacks, P.C.

(57) ABSTRACT

The present technology relates to an imaging element and a driving method, and an electronic device that enable stable driving with low voltage and low power consumption and furthermore make it possible to ensure a time resolution of detection. A light detector includes a pixel array section including a plurality of first pixels and a second pixel. The first pixel includes a photoelectric conversion section that photoelectrically converts incident light, a floating diffusion section that generates a voltage in accordance with the amount of charge carriers obtained by photoelectric conversion, and a transfer section that transfers charge carriers from the photoelectric conversion section to the floating diffusion section; the readout of a signal is performed intermittently from the first pixel. Further, the output of the second pixel is monitored continuously to detect the incidence of light. The present technology can be applied to a radiation counter.

12 Claims, 18 Drawing Sheets

(51) Int. Cl.
    *H01L 27/146*     (2006.01)
    *H04N 5/353*     (2011.01)
    *H04N 5/357*     (2011.01)
    *H04N 5/378*     (2011.01)
    *H04N 5/04*     (2006.01)
    *H04N 5/369*     (2011.01)

(52) U.S. Cl.
    CPC ............ *H01L 27/146* (2013.01); *H04N 5/04* (2013.01); *H04N 5/353* (2013.01); *H04N 5/3575* (2013.01); *H04N 5/3696* (2013.01); *H04N 5/378* (2013.01); *G01T 1/2002* (2013.01); *H01L 27/14663* (2013.01)

(56) References Cited

U.S. PATENT DOCUMENTS

| | | | |
|---|---|---|---|
| 2010/0072383 A1 | 3/2010 | Okada | |
| 2011/0080510 A1* | 4/2011 | Nishihara | H04N 5/378 348/308 |
| 2012/0305791 A1* | 12/2012 | Watanabe | G01T 1/247 250/394 |
| 2013/0009038 A1* | 1/2013 | Ishii | H01L 27/14607 250/208.1 |
| 2013/0068932 A1* | 3/2013 | Hu | H01L 27/14612 250/208.1 |
| 2013/0112851 A1* | 5/2013 | Ihori | H04N 5/32 250/208.1 |
| 2014/0205066 A1* | 7/2014 | Kitagawa | A61B 6/542 378/62 |
| 2014/0368707 A1* | 12/2014 | Ikeda | H04N 5/378 348/301 |
| 2015/0043715 A1 | 2/2015 | Kuwabara et al. | |
| 2015/0204988 A1* | 7/2015 | Dowaki | H04N 5/3456 378/62 |
| 2015/0304578 A1* | 10/2015 | Okura | H04N 5/363 348/308 |
| 2016/0216381 A1 | 7/2016 | Nishihara et al. | |
| 2016/0241795 A1 | 8/2016 | Nishihara | |

FOREIGN PATENT DOCUMENTS

| | | |
|---|---|---|
| CN | 104041010 A | 9/2014 |
| CN | 104247399 A | 12/2014 |
| CN | 104569002 A | 4/2015 |
| EP | 2858346 A1 | 4/2015 |
| JP | 2004179266 A | 6/2004 |
| JP | 2014-006235 A | 1/2014 |
| JP | 2014-139564 A | 7/2014 |
| JP | 2015-076773 A | 4/2015 |
| WO | WO 2014/097546 A1 | 6/2014 |
| WO | WO 2015/052864 A1 | 4/2015 |

OTHER PUBLICATIONS

International Preliminary Report on Patentability dated Jun. 28, 2018, in connection with International Application No. PCT/JP2016/085856.

Japanese Office Action dated Jan. 5, 2021, in connection with Japanese Application No. 2017-555975 and English translation thereof.

* cited by examiner

FIG. 3

| -14 | 24 | 13 | 0 | 26 |
|---|---|---|---|---|
| 6 | 17 | 4 | 26 | 33 |
| 3 | 6 | 6 | 11 | 5 |
| 21 | 9 | 1 | 7 | 10 |
| 29 | 26 | -3 | -3 | 7 |

IMAGING ELEMENT, DRIVING METHOD, AND ELECTRONIC DEVICE

CROSS REFERENCE TO RELATED APPLICATIONS

This application is a U.S. National Stage entry under 35 U.S.C. § 371 of International Application No. PCT/JP2016/085856, filed in the Japan Patent Office on Dec. 2, 2016, which claims priority to Patent Application No. JP2015-245286, filed in the Japan Patent Office on Dec. 16, 2015, each of which is incorporated by reference herein in its entirety.

TECHNICAL FIELD

The present technology relates to an imaging element and a driving method, and an electronic device, and relates particularly to an imaging element and a driving method, and an electronic device that enable stable driving with low voltage and low power consumption and furthermore make it possible to ensure a time resolution of detection.

BACKGROUND ART

Radiation counting (photon counting) that counts the dose of radiation incident on a detector while performing an individual energy separation on an incident photon basis is applied to various fields at present, such as survey meters, positron emission tomography (PET), and gamma cameras.

Usually a scintillator and a photomultiplier are used as the detector, and the energy and number of radiation carriers incident on the detector are counted.

If one or more photons of radiation enter the scintillator, the scintillator emits light, and releases a pulse of an amount of visible light in proportion to the energy of radiation (hereinafter, occasionally referred to as a light emission pulse).

Such a light emission pulse is emitted each time a radiation photon enters the scintillator, and is sensed by the photomultiplier.

Here, the scintillator is covered with a separating wall in which only a surface facing the photomultiplier is set in an open state. The separating wall blocks the entry of visible light from the outside, and preferably reflects light generated from the inside and causes all the light to be incident on the photomultiplier.

In a radiation counter including a scintillator and a photomultiplier, the photomultiplier converts a light emission pulse to electrons, and amplifies the electrons to generate an analog electrical pulse.

The pulse height of the analog electrical pulse is in proportion to the amount of emitted light of the scintillator, that is, the energy of radiation. Then, an independent pulse is outputted each time one radiation photon is incident; thus, the radiation counter can find the number of incident radiation photons by counting the number of pulses.

In the radiation counter described above, a detection circuit amplifies and shapes a pulse to change the pulse to an analog wave having a moderate delay, and converts the analog wave to a digital value with an analog-to-digital (A/D) converter. Thereby, the radiation counter can derive energy for each incident radiation photon, in a digital value.

A digital processing circuit in the radiation counter accumulates output results of the detection circuit obtained in a prescribed period of time, and derives an energy spectrum of radiation photons. This shows the existence ratio on an energy basis of the radiation photons captured by the radiation counter. Thereby, the radiation counter can identify the radiation source, and can separate radiation that is incident directly from a known radiation source and radiation that is scattered and has lost some energy on the way.

Further, as a radiation counter, also a radiation counter in which a scintillator and an imaging element are combined is proposed (for example, see Patent Literature 1). In this radiation counter, the imaging element is used as a detector of radiation, and the energy and number of radiation carriers are counted.

CITATION LIST

Patent Literature

Patent Literature 1: JP 2015-76773A

DISCLOSURE OF INVENTION

Technical Problem

Meanwhile, for radiation counters like those described above, one using a scintillator and a photomultiplier is the mainstream. However, the photomultiplier is expensive, and furthermore is not suitable for size and weight reduction and has the property of being susceptible to magnetic fields.

Thus, also a radiation counter that uses, in place of the photomultiplier, an array of avalanche photodiodes (APDs) or silicon photomultipliers (SiPMs), or the imaging element described above is proposed.

However, in a radiation counter using APDs, the output signal is very feeble, and furthermore there is a significant output variation due to temperature; hence, this radiation counter is likely to be affected by the external environment. Further, in a radiation counter using SiPMs, a high electric field is required and hence the dark current is large, and the floor noise is large due to after-pulses, crosstalk, etc.

Furthermore, both in the APD and the SiPM, a high voltage is used and hence a power supply circuit is needed additionally, and the output is an analog signal. Hence, it is necessary that an amplifier, an integrating circuit, and an A/D conversion circuit be externally attached additionally, and the counter is likely to be affected by external noise during the course of signal transmission.

Further, in a radiation counter using an imaging element, it has been difficult to ensure a sufficient time resolution for the detection of a light emission pulse generated by incident radiation.

The present technology has been made in view of such circumstances, and enables stable driving with low voltage and low power consumption and furthermore makes it possible to ensure a time resolution of detection.

Solution to Problem

According to a first aspect of the present technology, an imaging element includes: a pixel array section including a plurality of first pixels each including a first photoelectric conversion section configured to photoelectrically convert incident light, a floating diffusion section configured to generate a voltage in accordance with an amount of charge carriers obtained by the photoelectric conversion, and a transfer section configured to transfer the charge carriers from the first photoelectric conversion section to the floating diffusion section, and a second pixel configured to detect incidence of light. Readout of a signal is performed intermittently from each of the plurality of first pixels in accordance with the voltage, and an output of the second pixel is monitored continuously.

The imaging element may further include an event detection section configured to output a signal synchronized with incidence of light on the second pixel, on a basis of the output of the second pixel.

The imaging element may further include a driving section configured to control readout of a signal from the first pixel in accordance with an output of a signal from the event detection section.

The driving section may control the transfer section in accordance with an output of a signal from the event detection section to cause the charge carriers obtained by the photoelectric conversion to be transferred to the floating diffusion section, and control readout of a signal from the first pixel.

The imaging element may further include a detection section configured to generate a digital signal indicating an amount of light incident on the first pixel, on a basis of a signal read out from the first pixel.

The imaging element may, further include an output section configured to calculate an amount of light incident on the pixel array section, on a basis of the digital signal obtained for each of the plurality of first pixels.

The first pixel may further include a first amplification section configured to output a signal in accordance with the voltage generated by the floating diffusion section, and a selection section configured to enter a conduction state or a non-conduction state in accordance with control and, on entering the conduction state, output a signal outputted from the first amplification section, to the detection section.

The second pixel may include a second photoelectric conversion section configured to photoelectrically convert incident light, and a second amplification section configured to output a signal in accordance with charge carriers obtained by the photoelectric conversion by the second photoelectric conversion section.

The first pixel may be a non-multiplication-type pixel, and the second pixel may be a multiplication-type pixel.

A light receiving surface of the second pixel may be larger than a light receiving surface of the first pixel.

According to the first aspect of the present technology, there is provided a driving method for driving an imaging element, the imaging element including a pixel array section including a plurality of first pixels each including a photoelectric conversion section configured to photoelectrically convert incident light, a floating diffusion section configured to generate a voltage in accordance with an amount of charge carriers obtained by the photoelectric conversion, and a transfer section configured to transfer the charge carriers from the photoelectric conversion section to the floating diffusion section, and a second pixel configured to detect incidence of light, the driving method including: a step of continuously monitoring an output of the second pixel and detecting incidence of light on the second pixel on a basis of the output of the second pixel; and a step of resetting the first pixel periodically, and controlling readout of a signal according to the voltage from the first pixel, in accordance with detection of incidence of light on the second pixel.

According to the first aspect of the present technology, in the imaging element including a pixel array section including a plurality of first pixels each including a photoelectric conversion section configured to photoelectrically convert incident light, a floating diffusion section configured to generate a voltage in accordance with an amount of charge carriers obtained by the photoelectric conversion, and a transfer section configured to transfer the charge carriers from the photoelectric conversion section to the floating diffusion section, and a second pixel configured to detect incidence of light, an output of the second pixel is continuously monitored and incidence of light on the second pixel is detected on a basis of the output of the second pixel, and the first pixel is reset periodically, and readout of a signal according to the voltage from the first pixel is controlled in accordance with detection of incidence of light on the second pixel.

According to a second aspect of the present technology, an electronic device includes: a pixel array section including a plurality of first pixels each including a photoelectric conversion section configured to photoelectrically convert incident light, a floating diffusion section configured to generate a voltage in accordance with an amount of charge carriers obtained by the photoelectric conversion, and a transfer section configured to transfer the charge carriers from the photoelectric conversion section to the floating diffusion section, a second pixel configured to detect incidence of light. Readout of a signal is performed intermittently from each of the plurality of first pixels in accordance with the voltage, and an output of the second pixel is monitored continuously.

According to the second aspect of the present technology, an electronic device is provided with: a pixel array section including a plurality of first pixels each including a photoelectric conversion section configured to photoelectrically convert incident light, a floating diffusion section configured to generate a voltage in accordance with an amount of charge carriers obtained by the photoelectric conversion, and a transfer section configured to transfer the charge carriers from the photoelectric conversion section to the floating diffusion section, a second pixel configured to detect incidence of light. Readout of a signal is performed intermittently from each of the plurality of first pixels in accordance with the voltage, and an output of the second pixel is monitored continuously.

Advantageous Effects of Invention

According to a first aspect and a second aspect of the present technology, stable driving is possible with low voltage and low power consumption, and furthermore a time resolution of detection can be ensured.

BRIEF DESCRIPTION OF DRAWINGS

FIG. 3 is a diagram describing pixel outputs.

MODE(S) FOR CARRYING OUT THE INVENTION

Hereinbelow, embodiments to which the present technology is applied are described with reference to the drawings.

First Embodiment

<Configurational Example of Radiation Counting Apparatus>

The present technology makes it possible to detect, with high accuracy, the amount and the incidence timing of feeble pulse light of radiation counting or the like. In particular, according to the present technology, when detecting the amount and the incidence timing of feeble pulse light, stable driving is possible with low voltage and low power consumption, and furthermore a sufficient time resolution can be ensured.

The present technology can be applied to, for example, various electronic devices such as radiation counters and nuclear medical diagnosis apparatuses of flow cytometry, PET, etc. In the following, first, a description is given using as an example a case where the present technology is applied to a radiation counter.

A radiation counter to which the present technology is applied can perform radiation counting accurately, is small in size and light in weight, is resistant to environmental variations, and can be stably driven with low voltage and low power consumption. Furthermore, the radiation counter can also ensure a time resolution of detection sufficiently, and can be used also for coincidence counting of a nuclear medical diagnosis apparatus such as a PET.

Figure 1:
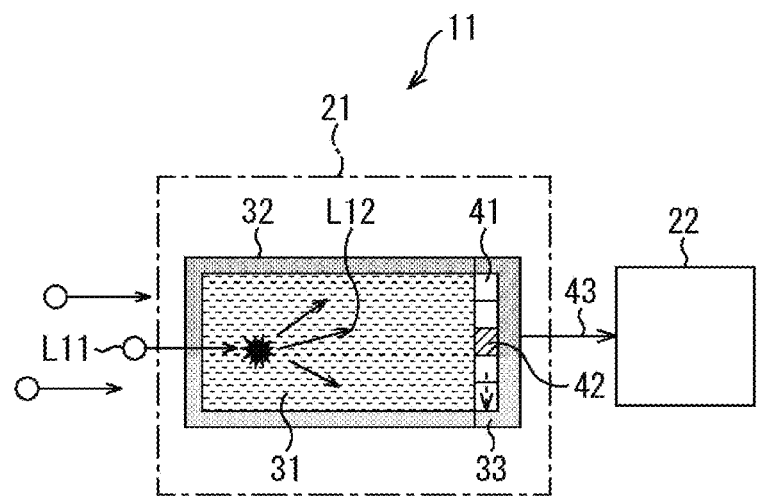
FIG. 1 is a diagram showing a configurational example of a radiation counting apparatus.
Figure 2:
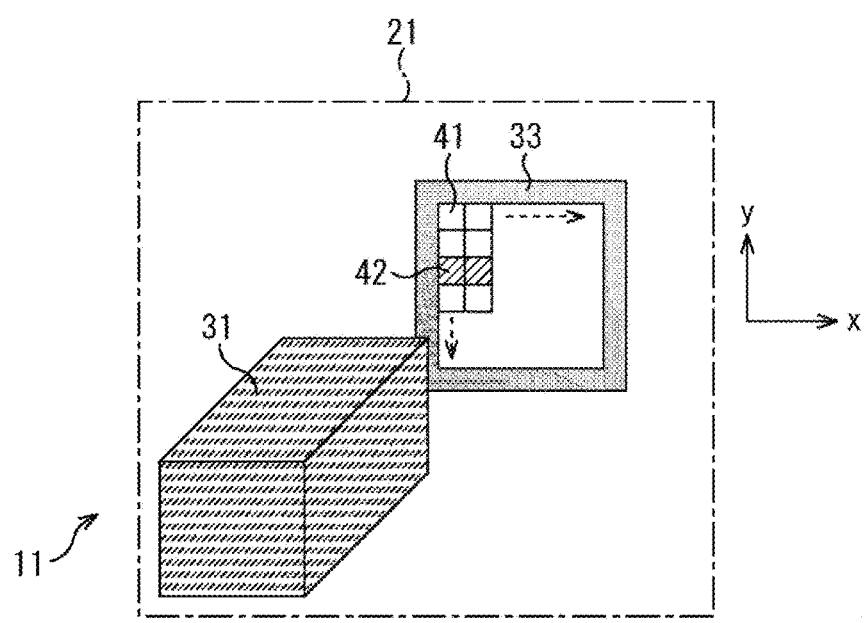
FIG. 2 is a diagram showing a configurational example of a radiation counting apparatus.

FIG. 1 and FIG. 2 are diagrams showing a configurational example of an embodiment of a radiation counting apparatus that is a radiation counter to which the present technology is applied. Note that FIG. 1 shows a cross-sectional view of a radiation counting apparatus 11, and FIG. 2 shows a perspective view of the radiation counting apparatus 11. Further, portions corresponding between FIG. 1 and FIG. 2 are marked with the same reference numerals.

The radiation counting apparatus 11 includes a light receiving section 21 and a data processing section 22.

The light receiving section 21 includes a scintillator 31, a separating wall 32, and a light detector 33. Note that, in FIG. 2, the illustration of the separating wall 32 is omitted.

The scintillator 31 generates photons if radiation is incident. The scintillator 31 contains, for example, $Lu_2SiO_5:Ce$ (LSO), and is fashioned in a columnar shape of a 2-millimeter (mm) square.

The separating wall 32 covers the scintillator 31 and blocks visible light. However, in the separating wall 32, only a surface facing the light detector 33 is opened. Further, the separating wall 32 preferably contains, for example, a reflective substance that reflects light, such as aluminum. Thereby, most of the photons generated in the scintillator 31 can be caused to be incident on the light detector 33.

The light detector 33 includes, for example, a solid-state imaging element such as a complementary metal oxide semiconductor (CMOS) image sensor, and detects light incident from the scintillator 31 and generates a digital signal.

The light detector 33 has a light receiving surface facing the scintillator 31, and a plurality of (e.g., 100×100) pixel circuits 41 are provided in a two-dimensional lattice configuration on the light receiving surface. Furthermore, on the light receiving surface of the light detector 33, a pixel circuit 42 having a use at least different from the use of the pixel circuit 41 is inserted in an array of one row. The pixel circuit 41 and the pixel circuit 42 are designed as, for example, a non-multiplication-type pixel.

In the example shown in FIG. 2, the horizontal direction and the vertical direction are taken as the x direction and the y direction in FIG. 2, respectively, and a plurality of pixel circuits are provided to be arranged in the x direction and the y direction on the light receiving surface. Note that herein only some of the plurality of pixel circuits are marled with reference numerals; among the pixel circuits shown by the quadrangles on the light receiving surface, the pixel circuit marked with oblique lines shows the pixel circuit 42, and the pixel circuit not marked with oblique lines shows the pixel circuit 41.

Thus, in this example, it can be seen that one pixel row including pixel circuits 42 that are arranged in the x direction is inserted in the array of pixel circuits. Note that, hereinafter, the pixel circuit 41 may be referred to as simply a pixel 41, and the pixel circuit 42 may be referred to as simply a pixel 42.

The light detector 33 supplies a digital signal that is obtained by the pixel 41 or the pixel 42 receiving and photoelectrically converting light incident from the scintillator 31, to the data processing section 22 via a signal line 43.

The data processing section 22 processes a digital signal supplied from the light detector 33 to perform radiation counting. Further, the data processing section 22 records a time stamp of radiation that has entered the scintillator 31, and investigates the amount of light of a light emission pulse generated in accordance with the entry of radiation into the scintillator 31 and assesses the energy of radiation.

Here, the time stamp indicates the time of entry of radiation into the scintillator 31, and is generated on the basis of an output from the pixel 42. Further, the derivation of the amount of light of a light emission pulse is performed on the basis of an output from the pixel 41.

Note that the method for inserting pixels 42, that is, the arrangement of pixels 42 on the light receiving surface of the light detector 33 may be any type; for example, a plurality of rows of pixels 42 may be inserted. However, in order that pixels 41 used for measuring the amount of light can receive a large amount of light, the occupation area of pixels 42 in the entire light receiving surface of the light detector 33 may be set to less than or equal to a half, preferably less than or equal to ¼, of the light receiving surface.

Further, the scintillator 31 and the light detector 33 are preferably bonded together by an optical adhesive having an appropriate refractive index. Further, a light guide using fiberglass or the like may be inserted between the scintillator 31 and the light detector 33.

Furthermore, a radiation counter having a space resolution of a PET, a gamma camera, or the like can be produced by tiling (arraying) a set of the scintillator 31 and the light detector 33 in the x direction and the y direction in FIG. 2.

Meanwhile, in radiation counting, as shown in FIG. 1, a feeble light emission pulse containing, for example, several thousand photons L12 that are generated by, for example, one radiation carrier L11 being photoelectrically absorbed in the scintillator 31 is measured. In the light detector 33, photons L12 of a light emission pulse generated in this way are received by a pixel array including a plurality of pixels 41 and a plurality of pixels 42, and each pixel performs an independent output in accordance with the light receiving condition.

For example, the pixel 41 accumulates, in this pixel 41, charge carriers generated by a photoelectric conversion element provided therein. The pixel 41 can accumulate a plurality of charge carriers corresponding to the incidence of a plurality of photons. That is, the output of the pixel 41 changes in accordance with the number of photons incident on this pixel 41.

A signal that is an output of the pixel 41 and is in accordance with the accumulated charge carriers of the pixel 41 is read out at a desired timing, as necessary, and is converted by an A/D converter to a digital value having a gradation larger than 1 bit. Further, the pixel 41 has a function of resetting the inside to a dark state where there is no photon incidence.

On the other hand, the pixel 42 outputs a signal synchronized with a received light emission pulse, in accordance with charge carriers generated by a photoelectric conversion element provided therein. The output of each pixel 42 is monitored constantly during the period of detection of a light emission pulse, and is sensed as a light emission event of a light emission pulse.

Here, an example of outputs of a group of pixels 41 is shown in FIG. 3.

In FIG. 3, each quadrangle represents one pixel 41, and the numerical value in each of those quadrangles represents the value (digital value) of the output signal of the pixel 41.

In this example, if one least significant bit (LSB) is taken as the minimum unit, the value of an output signal on the occasion when the pixel 41 has received one photon corresponds to 10 LSBs. Each output signal includes a signal corresponding to the received photons and readout noise, and there is a case where the value of the output signal is a negative value, depending on the magnitude of readout noise.

Note that, although herein the value of the output signal is written as a negative value as it is, the output signals of all the pixels 41 may be processed by offsetting, or an output signal with a negative value may undergo processing of rounding the value up to zero.

Thus, the light detector 33 is an aggregate of pixels 41 each of which is a high-sensitivity light detection cell having a gradation output.

The pixel 41 is a non-multiplication-type pixel that does not perform electron multiplication with a strong electric field like in an APD or an SiPM, and its output signal is minute. Hence, significant readout noise is contained in the output signal of the pixel 41, and therefore the number of incident photons in the individual pixel 41 is ambiguous. However, the amount of light of a light emission pulse corresponding to one radiation carrier can be found with high accuracy by synthesizing the output signals of the pixels 41.

For example, a photomultiplier or a common APD detects a light emission pulse with a single detector, and generates an analog pulse in accordance with the amount of light. On the other hand, an SiPM receives a light emission pulse with a pixel array, but only a pixel that has experienced photon incidence outputs a certain charge pulse in a binary manner. Then, the definitive output intensity is determined by the number of pulse-fired pixels.

That is, all of these pixels are different from the form of the light detector 33. Further, each of these light detectors including a photomultiplier, an APD, or an SiPM has a response close to the response of the pixel 42 in that each of these light detectors outputs a signal in synchronization with the incidence of photons as a light emission pulse, and is clearly different from the pixel 41. Note that detailed configurational examples of the pixel 41 and the pixel 42 are described later.

<With Regard to Operation of Radiation Counting Apparatus>

Next, an example of the operation of the radiation counting apparatus 11 is described.

Figure 4:
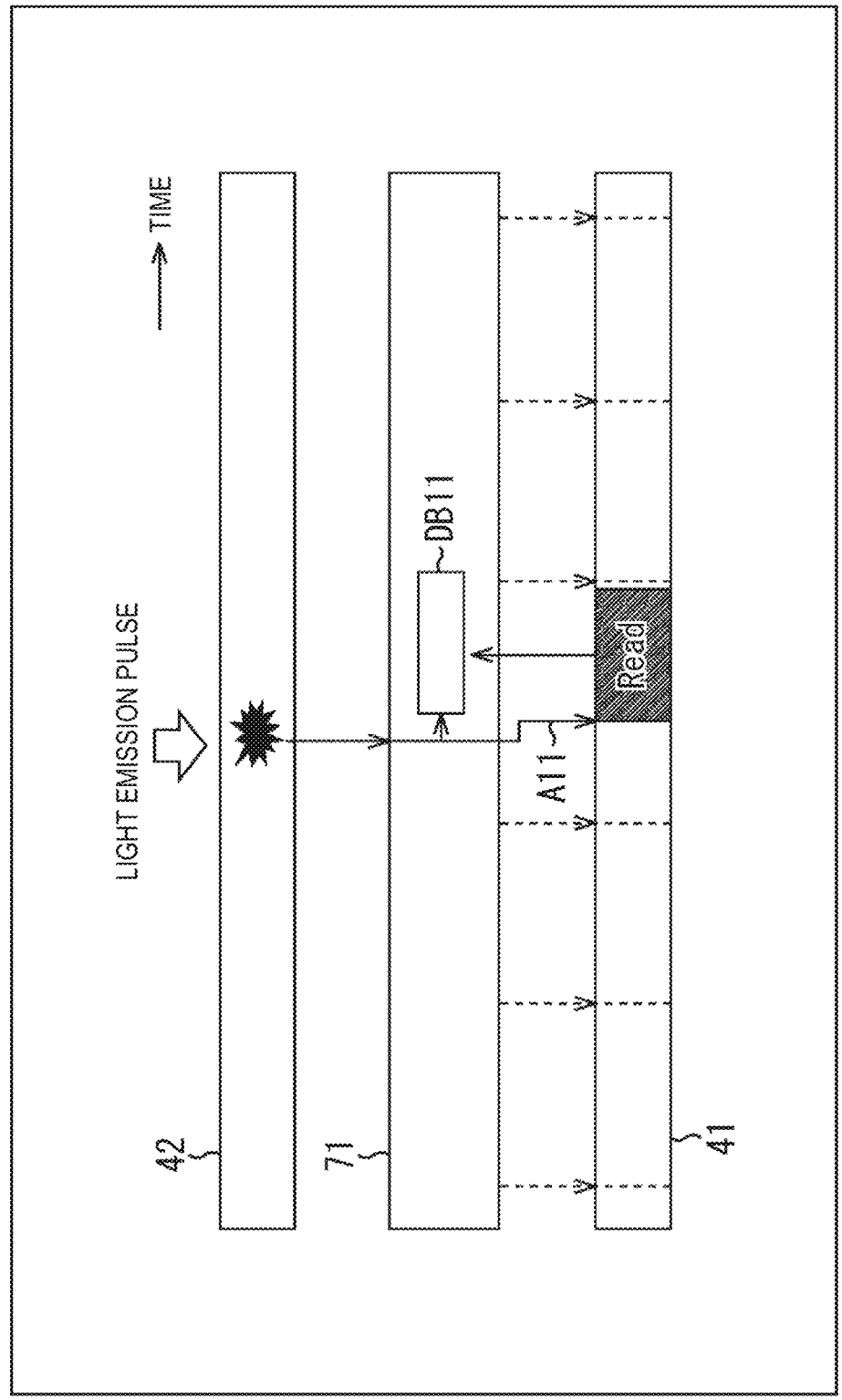
FIG. 4 is a diagram describing an example of operation of a radiation counting apparatus.

It is assumed that, for example as shown in FIG. 4, a control circuit 71 is obtained from a part of the light detector 33 and a part of the data processing section 22, and the operation of the light detector 33 during radiation counting is controlled by the control circuit 71. Note that, in FIG. 4, portions corresponding to those in the case of FIG. 1 are marked with the same reference numerals, and a description thereof is omitted as appropriate. Further, in FIG. 4, the horizontal direction represents time.

Each pixel 41 receives a reset signal derived from the control circuit 71, and the pixels 41 are reset on a periodic basis, preferably all at once.

In FIG. 4, the dotted arrow connecting the control circuit 71 and the pixel 41 represents a reset signal, and the period between a round of resetting and the next round of resetting of the pixel 41 by reset signals is taken as a unit detection period. Each pixel 41 accumulates, during each unit detection period, charge carriers obtained by photoelectrically converting photons incident from the scintillator 31, and releases the accumulated charge carriers in accordance with a reset signal to reset this pixel 41.

Further, if radiation enters the scintillator 31 to generate a light emission pulse and the pixel 42 of the light detector 33 receives the light emission pulse, that is, photons of the light emission pulse, the light detector 33 outputs an event signal in accordance with an output signal derived from the pixel 42.

The event signal is outputted when a light emission pulse is received by the pixel 42, and is a signal indicating that one radiation carrier has entered the scintillator 31.

In particular, in the light detector 33, the output of the pixel 42 is monitored continuously, that is, constantly to detect the incidence of a light emission pulse on the pixel 42; if the incidence of a light emission pulse on the pixel 42 is detected, an event signal indicating that fact is outputted immediately. In other words, the event signal can be said to be a signal that is outputted substantially simultaneously with the generation of a light emission pulse, that is, a signal synchronized with the incidence of a light emission pulse on the pixel 42. In the following, the generation of a light emission pulse indicated by an event signal may be referred to as a light emission event.

The control circuit 71 supplied with an event signal derived from the light detector 33 generates a data object DB11 and records the time stamp of the light emission event on the data object DB11, and causes the readout of an output signal from the pixel 41 to start.

In this example, the readout of an output signal from the pixel 41 has been started since the timing indicated by arrow A11, and output signals are read out sequentially from the plurality of pixels 41 arranged on the light receiving surface.

Then, for example, the control circuit 71 records, on the data object DB11, the sum total (additional value) of the values of output signals read out from the pixels 41, as a value indicating the amount of light of the light emission pulse. In the following, the sum total of the values of output signals of all the pixels 41 may be referred to as an output synthetic value.

Thus, while the output of the pixel 42 is monitored constantly, the readout of a signal from the pixel 41 is performed only when a light emission event is detected. That is, the readout of a signal from the pixel 41 is performed intermittently.

If the readout of output signals from all the pixels 41 is completed, then the pixel 41 is reset again at a prescribed timing, and the next unit detection period is started. The data object DB11 in which a time stamp and an output synthetic value of the pixels 41 make a set in this way is saved in an external memory or a memory in the control circuit 71.

Note that the whole or a part of the function of the control circuit 71 may be enclosed in the light detector 33, or may be enclosed in the data processing section 22.

Further, for example, in a case where the radiation source is known, the control circuit 71 may further assess whether the output synthetic value is in a proper energy range or not, and may discard the data object of an output synthetic value that is assessed as not being in a proper energy range, that is, regarded as an error. Furthermore, after the assessment of whether the output synthetic value is in a proper energy range or not, the control circuit 71 may save only the time stamp and some flags. Conversely, in a case where the time stamp is unnecessary, the control circuit 71 may save only data related to the output synthetic value.

The detection of a light emission pulse by an operation like the above enables a great reduction in the amount of data processing and power consumption, because readout is performed and the subsequent processing and recording are performed only on a significant light emission signal, that is, an output signal obtained by receiving a light emission pulse.

Thus, the light detector 33 can be used for all types of pulse light detection, but is particularly effective in a case where the timing of generation of pulse light is unknown. For example, radiation counting such as survey meters, PET, and single photon emission computed tomography (SPECT), fluorescence and side scattered light detection in flow cytometry, and the like fall under such a case.

Further, the present technology is effective in fields in which pulse detection requires a nanosecond-level time resolution, particularly such as coincidence counting of gamma rays in PET.

The pixel 41, which is of a charge carrier accumulation type and the output of which does not synchronize with a light emission pulse, is advantageous for downsizing, reduction of voltage, environmental tolerance, and stable operation, but has difficulty in obtaining a nanosecond-level time resolution by itself. This is because the pixel 41 by itself cannot find what time point a light emission event has occurred at, and cannot obtain a time resolution exceeding a frame rate that is obtained when the readout time of output signals of one row including pixels 41 or one round of readout of signals from all the pixels 41 is taken as one frame.

Thus, by additionally providing the pixel 42 designed specially for light emission event detection in the light detector 33, the radiation counting apparatus 11 makes it possible to generate a correct time stamp and achieve both the ensuring of a high time resolution and stable driving with a reduced size, low voltage, and low power consumption.

<Configurational Example of Pixel for Measuring Amount of Light>

Next, a more detailed configuration of the pixel 41 for measuring the amount of light of a light emission pulse is described.

Figure 5:
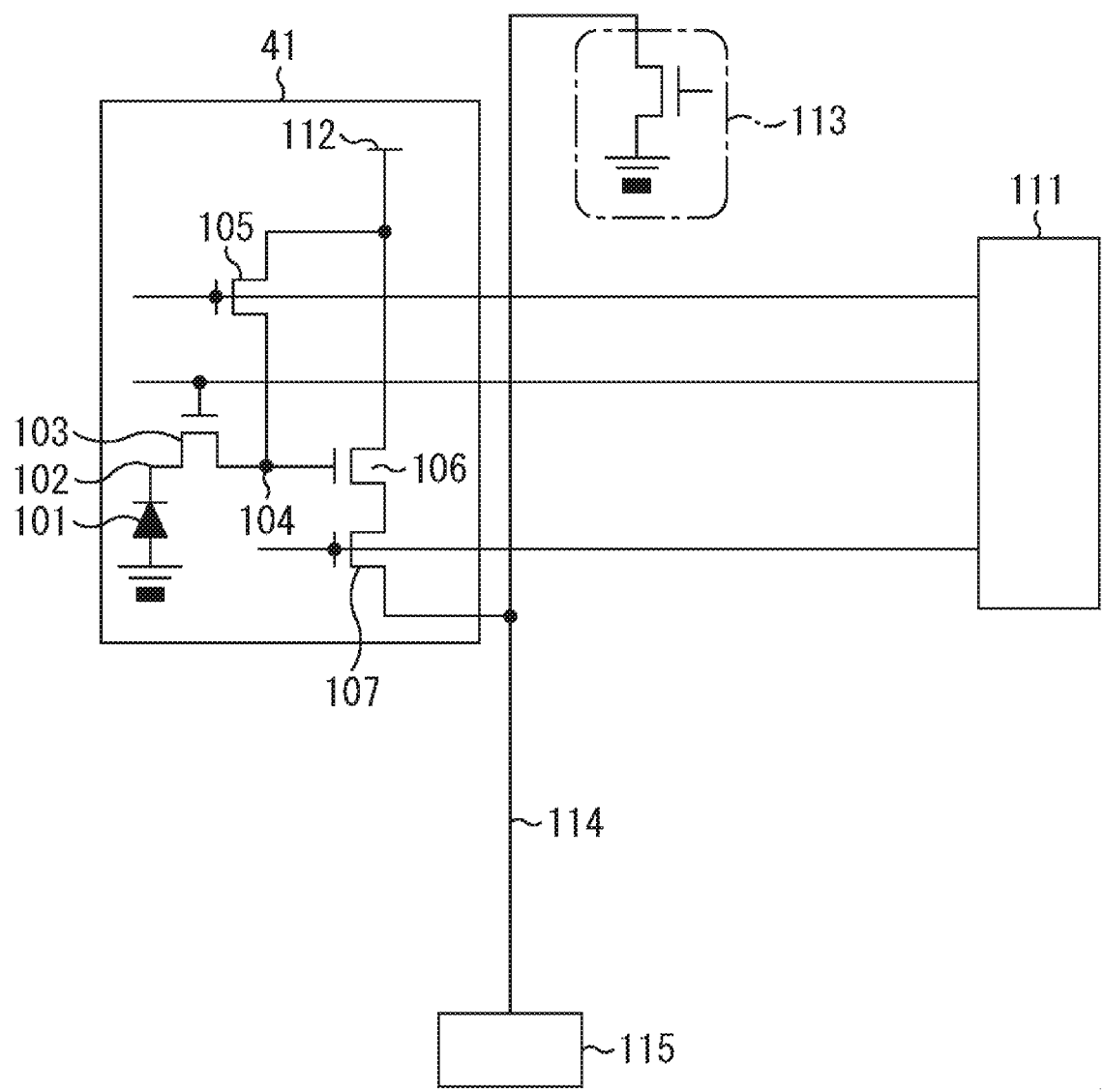
FIG. 5 is a diagram showing a configurational example of a pixel for measuring the amount of light.

The pixel 41 for measuring the amount of light of a light emission pulse has the configuration shown in FIG. 5, for example.

That is, the pixel 41 includes a photodiode 101, an accumulation node 102, a transfer transistor 103, a detection node 104, a reset transistor 105, an amplification transistor 106, and a selection transistor 107.

For example, an n-type metal-oxide-semiconductor (MOS) transistor is used as the transfer transistor 103, the reset transistor 105, the amplification transistor 106, and the selection transistor 107. Further, the photodiode 101 is designed as a non-multiplication-type photodiode.

The photodiode 101 is connected to the transfer transistor 103 via the accumulation node 102, and receives and photoelectrically converts photons of a light emission pulse incident from the scintillator 31. That is, the photodiode 101 generates pairs of electrons and holes from photons incident on a silicon substrate of the pixel 41 by photoelectric conversion, and accumulations electrons (charge carriers) of the pairs in the accumulation node 102. The photodiode 101 is preferably of an embedded type that is completely depleted during charge carrier release by resetting.

The transfer transistor 103 transfers charge carriers from the accumulation node 102 to the detection node 104, in accordance with control of a row driving circuit 111. The detection node 104 includes, for example, a floating diffusion layer; and accumulates charge carriers transferred from the transfer transistor 103, and generates an analog voltage in accordance with the amount of accumulated charge carriers. This voltage is applied to the gate of the amplification transistor 106.

The reset transistor 105 extracts the charge carriers accumulated in the accumulation node 102 and the detection node 104 to a power source 112, that is, causes the accumulated charge carriers to be released, and performs initialization. The gate of the reset transistor 105 is connected to the row driving circuit 111, the drain is connected to the power source 112, and the source is connected to the detection node 104.

The row driving circuit 111 controls the reset transistor 105 to the ON state simultaneously with the transfer transistor 103, for example; and thereby causes the electrons (charge carriers) accumulated in the accumulation node 102 to be released to the power source 112, and initializes the pixel 41 to a dark state prior to charge carrier accumulation, that is, a state where light is not incident on the photodiode 101 yet. In other words, the photodiode 101 is reset. Further, the row driving circuit 111 controls only the reset transistor 105 to the ON state; and thereby causes the charge carriers accumulated in the detection node 104 to be released to the power source 112, and initializes the amount of charge carriers.

The amplification transistor 106 amplifies the voltage of its gate. The gate of the amplification transistor 106 is connected to the detection node 104, the drain is connected to the power source 112, and the source is connected to the selection transistor 107. The amplification transistor 106 and a constant current circuit 113 form a source follower, and the voltage of the detection node 104 is outputted by the amplification transistor 106 to a vertical signal line 114, with a gain of just under 1.

An electrical signal of the voltage outputted from the amplification transistor 106 to the vertical signal line 114 via the selection transistor 107 is a signal indicating the amount of light of photons incident on the pixel 41, and is acquired by a detection circuit 115 including a not-illustrated A/D conversion circuit.

The selection transistor 107 enters the conduction state or the non-conduction state in accordance with control of the row driving circuit 111, and during the conduction state, outputs an electrical signal that is outputted from the amplification transistor 106 and is in accordance with the voltage of the detection node 104. The gate of the selection transistor 107 is connected to the row driving circuit 111, the drain is connected to the amplification transistor 106, and the source is connected to the vertical signal line 114.

During the period from when the photodiode 101 is reset to when the readout of a signal in accordance with the amount of light of incident photons is performed, the pixel 41 accumulates charge carriers obtained by photoelectric conversion in the inside; and during readout, the pixel 41 outputs a signal in accordance with the accumulated charge carriers. In the pixel 41, such accumulation and readout of charge carriers in a unit period are performed repeatedly; if photons of a light emission pulse are incident on the pixel 41 during charge carrier accumulation, the result can be obtained at the time of readout.

Meanwhile, a feature of such a photodiode 101 of an embedded type is that the detection node 104 and the accumulation node 102 of the photodiode 101 are not capacitively coupled during readout. As a result, as the parasitic capacitance of the detection node 104 is reduced, the efficiency of conversion of accumulated charge carriers to a voltage signal is improved, and the sensitivity to the incidence of one photon can be improved.

Further, since the detection node 104 and the accumulation node 102 are not capacitively coupled during readout, the conversion efficiency does not worsen even if the photodiode 101 is expanded to a larger size, that is, even if the area of the light receiving surface of the photodiode 101 is increased.

Therefore, as the photodiode 101 is expanded to a larger size, a larger amount of photons can be received, and thus the sensitivity per pixel 41 to the same luminous flux density is improved. Note that similar properties are observed also in a MOS-type photoelectric conversion element.

Further, such a pixel 41 generally does not involve electron multiplication like in an APD, a SiPM, or a photomultiplier. Therefore, the output of such a pixel 41 is affected by readout noise derived from the amplification transistor 106 or a later-stage A/D conversion circuit; however, the effect is relatively minimized by using the properties mentioned above to maximize pixel sensitivity.

That is, the parasitic capacitance of the detection node 104 is made as small as possible, and the photodiode 101 is expanded to as large a size as possible to the extent that single-electron transfer is possible; thereby, the signal-to-noise ratio (S/N ratio) of the output of the pixel 41 is maximized. Thus, a pixel 41 as a high-sensitivity detector used in the radiation counting apparatus 11 is obtained.

<Example 1 of Driving of Pixel for Measuring Amount of Light>

Figure 6:
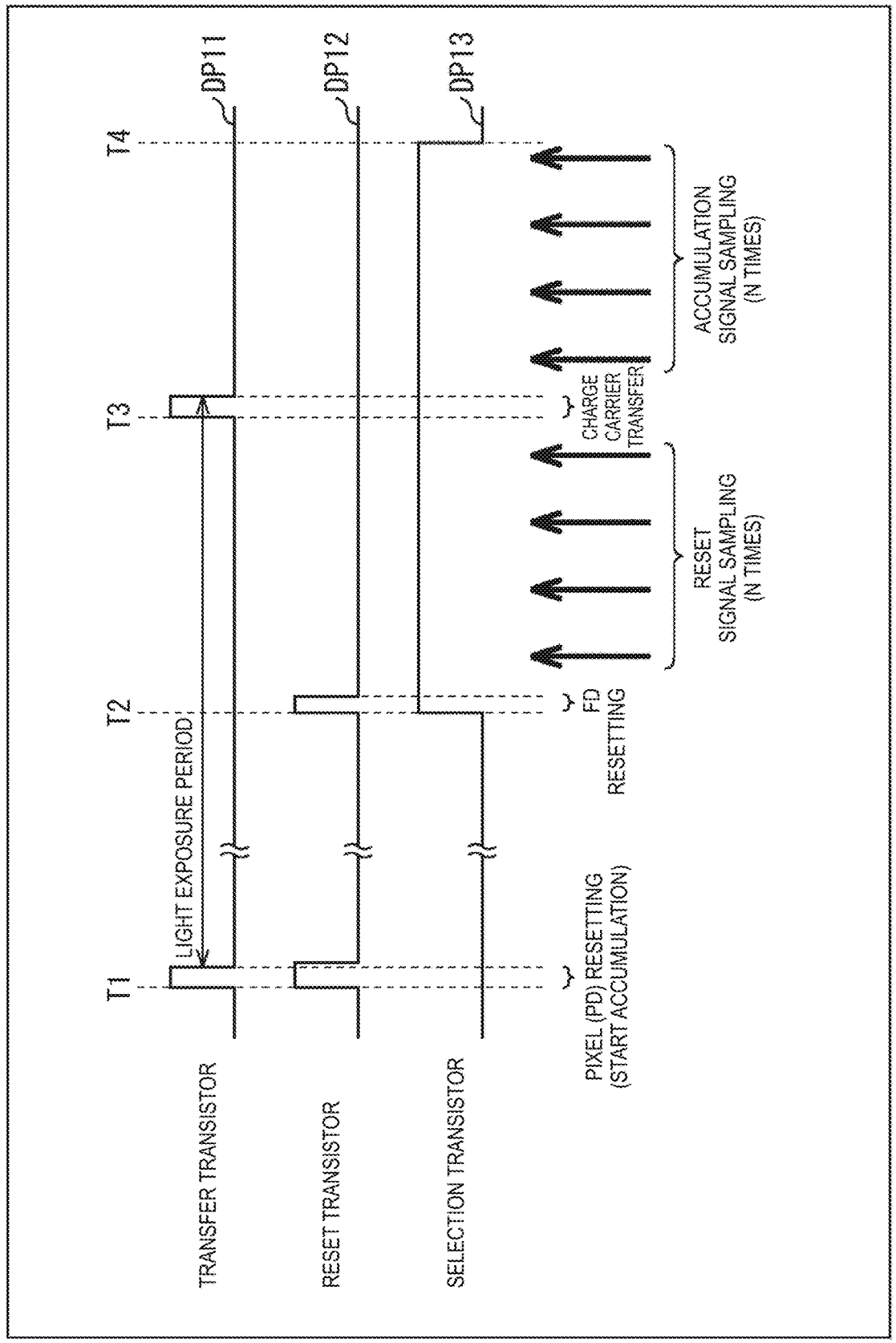
FIG. 6 is a diagram showing an example of driving of a pixel during radiation counting.

Next, the driving of the pixel 41, that is, the operation of the pixel 41 during radiation counting is described. FIG. 6 is a timing chart showing an example of the driving of the pixel 41 during radiation counting.

Note that, in FIG. 6, the horizontal direction represents time. Further, in FIG. 6, polygonal line DP11 to polygonal line DP13 represent the ON or OFF states of the transfer transistor 103, the reset transistor 105, and the selection transistor 107, respectively.

That is, the section where each of polygonal line DP11 to polygonal line DP13 is convex upward indicates a section where each transistor is in the ON state, that is, the conduction state; and the section where each of polygonal line DP11 to polygonal line DP13 is convex downward indicates a section where each transistor is in the OFF state, that is, the non-conduction state.

First, at timing T1 immediately before a light exposure period, the row driving circuit 111 controls both the transfer transistor 103 and the reset transistor 105 to the ON state. That is, the row driving circuit 111 sets a driving signal to be supplied to the gates of those transistors to a high level (H-level), and thereby causes the transfer transistor 103 and the reset transistor 105 to be switched on.

By this control, all the charge carriers accumulated in the accumulation node 102 between the photodiode 101 and the transfer transistor 103 are released to the power source 112, and the photodiode 101 is reset. In the following, such control may be referred to as photodiode (PD) resetting.

After the PD resetting, the row driving circuit 111 controls the transfer transistor 103 to the OFF state. By this control, the accumulation node 102 enters a floating state, and a new round of charge carrier accumulation is started. That is, the PD resetting is removed, and a light exposure period of the pixel 41 is started.

In the light exposure period, the photodiode 101 receives and photoelectrically converts light (photons) incident from the scintillator 31. Then, charge carriers (electrons) obtained by photoelectric conversion by the photodiode 101 are continuously accumulated in the accumulation node 102.

Further, after the PD resetting, more specifically, after the start of the light exposure period, the row driving circuit 111 controls the reset transistor 105 to the OFF state. Note that, during charge carrier accumulation, the reset transistor 105 may remain in the ON state.

On the other hand, the selection transistor 107 is controlled to the OFF state in order to allow access to another pixel 41 connected to the vertical signal line 114, that is, the readout of a signal from another pixel 41.

Next, the operation of readout of accumulation signals is described. In the readout operation, first the sampling of reset signals is performed as pre-processing, and next the light exposure period is ended and the sampling of accumulation signals is performed. That is, the readout operation is performed by two-step sampling.

Here, timing T2 is a timing at which a light emission event is detected, that is, the timing indicated by arrow A11 of FIG. 4, for example. Note that, in a case where the readout of a signal is performed for each row of pixels 41, the timing at which the row is specified as a readout row after the timing indicated by arrow A11 serves as timing T2.

Then, at timing T2 prior to the end of the light exposure period, the row driving circuit 111 controls the reset transistor 105 and the selection transistor 107 to the ON state.

By the control of setting the selection transistor 107 to the ON state, the pixel 41 enters a selection state, and the pixel 41 is electrically connected to the vertical signal line 114. That is, it becomes possible for an output from the amplification transistor 106 to be read by the detection circuit 115 via the selection transistor 107 and the vertical signal line 114.

Further, by the control of setting the reset transistor 105 to the ON state, the detection node 104, which is the input of the amplification transistor 106, and the power source 112 are short-circuited. Thereby, a reference electric potential is generated in the selected pixel 41. That is, the electric potential of the detection node 104 is reset to the electric potential of the power source 112.

If a pulse period, that is, a period equivalent to one pulse has elapsed from timing T2, the row driving circuit 111 controls the reset transistor 105 to the OFF state. By this control, the electric potential of the detection node 104 undergoes coupling with the gate of the reset transistor 105 and decreases from the reference electric potential to some degree, and enters a floating state.

Furthermore, on this occasion, significant kT/C noise is generated in the detection node 104. In general, a floating diffusion layer is used as the detection node 104. Thus, in the following, the control that sets the reset transistor 105 to the ON state at timing T2 and then sets the reset transistor 105 to the OFF state to reset the detection node 104 may be referred to as FD resetting.

If FD resetting is performed, then the detection circuit 115 performs one or more times (for example, four times) of sampling during the period up to the end of the light exposure period.

Specifically, the detection circuit 115 A/D-converts a signal of the electric potential of the vertical signal line 114, as a reset signal of the pixel 41, and obtains a digital signal Ds1. The detection circuit 115 performs such sampling several times.

By such sampling, a signal in accordance with the voltage of the detection node 104 is read out to the detection circuit 115 via the amplification transistor 106, the selection transistor 107, and the vertical signal line 114, and the read out signal is A/D-converted into a digital signal Ds1.

The sampling of reset signals by the detection circuit 115 is treated as the first round of readout in correlated double sampling.

Further, at timing T3 before the light exposure period ends, the row driving circuit 111 controls the transfer transistor 103 to the ON state.

By this control, charge carriers accumulated in the accumulation node 102 are transferred to the detection node 104 by the transfer transistor 103. On this occasion, if the potential of the detection node 104 is sufficiently deep, all the electrons (charge carriers) accumulated in the accumulation node 102 are transferred to the detection node 104, and the accumulation node 102 enters a complete depletion state.

If a pulse period has elapsed from timing T3, the row driving circuit 111 controls the transfer transistor 103 to the OFF state.

By this control, the electric potential of the detection node 104 drops by an amount equivalent to the amount of accumulated charge carriers as compared to before the driving of the transfer transistor 103. That is, the potential of the detection node 104 becomes shallower. A voltage equivalent to this electric potential drop is amplified by the amplification transistor 106, and is outputted to the vertical signal line 114 via the selection transistor 107.

In other words, a signal in accordance with the voltage of the detection node 104 is supplied to the detection circuit 115 via the amplification transistor 106, the selection transistor 107, and the vertical signal line 114.

If the transfer transistor 103 is set to the OFF state in this way, the light exposure period ends.

If the light exposure period ends, then the detection circuit 115 performs one or more times (for example, four times) of sampling during the period up to timing T4.

Specifically, the detection circuit 115 A/D-converts a signal of the electric potential of the vertical signal line 114, as an accumulation signal of the pixel 41, and obtains a digital signal Ds2. The detection circuit 115 performs such sampling several times.

By such sampling, a signal in accordance with the voltage of the detection node 104 is read out to the detection circuit 115 via the amplification transistor 106, the selection transistor 107, and the vertical signal line 114, and the read out signal is A/D converted into a digital signal Ds2.

The sampling of accumulation signals by the detection circuit 115 is treated as the second round of readout in correlated double sampling.

The detection circuit 115 compares the sampled accumulation signal, namely the digital signal Ds2, and the reset signal, namely the digital signal Ds1, and assesses the amount of photons incident on the pixel 41, on the basis of the comparison result.

For example, the detection circuit 115 adds all the plurality of digital signals Ds1 obtained by sampling, and takes the addition result as a signal indicating a reset level of the pixel 41.

Similarly, the detection circuit 115 adds all the plurality of digital signals Ds2 obtained by sampling, and takes the addition result as a signal indicating a signal level of the pixel 41.

Then, the detection circuit 115 calculates the difference between the result of addition (additional value) of the digital signals Ds1 and the result of addition (additional value) of the digital signals Ds2, as a net accumulation signal, that is, the definitive digital output signal indicating the amount of light of photons incident on the pixel 41, and outputs the result to a later stage.

Note that, although herein an example in which the additional values of the digital signals Ds1 and the digital signals Ds2 are found is described, it is also possible to calculate the average values of the digital signals Ds1 and the digital signals Ds2, and take the difference between the average values as the definitive output signal of the pixel 41.

Further, at timing T4, the row driving circuit 111 controls the selection transistor 107 to the OFF state, and the readout of an output signal in one unit detection period from the pixel 41 ends.

In the driving of the pixel 41 like the above, kT/C noise generated during FD resetting is offset by taking the difference between the digital signal Ds1 and the digital signal Ds2 as a net accumulation signal, and an output signal with small noise can be obtained in the end. Further, since the signal is leveled by performing the sampling of the digital signal Ds1 and the digital signal Ds2 multiple times, an output signal with small noise can be obtained.

As described above, the light exposure period of each pixel 41 is the period between the PD resetting operation and the operation of readout of the accumulation signal. More specifically, the period from when the transfer transistor 103 becomes OFF immediately after timing T1 to when the transfer transistor 103 becomes OFF immediately after timing T3 is taken as the light exposure period.

If during the light exposure period photons are incident on the photodiode 101 and charge carriers are generated, they are the difference between the reset signal and the accumulation signal, and the value of the difference is derived as the value of an output signal by the detection circuit 115, in accordance with the procedure described above.

Note that, in the example of the operation (sequence) shown in FIG. 4, the readout of an accumulation signal corresponding to accumulated charge carriers is not performed if a light emission event is not detected. That is, the readout of an accumulation signal from the pixel 41 is performed intermittently. Hence, in a case where a light emission event has not been detected, the period between a round of PD resetting and the next round of PD resetting serves as a light exposure period. A main object of such periodic PD resetting in a dark state is the release of noise charge carriers accumulated due to dark current, etc.

<Example 2 of Driving of Pixel for Measuring Amount of Light>

The driving sequence of the pixel 41 described with reference to FIG. 6 is a typical example of the driving sequence of an accumulation-type pixel; but different types of driving may be performed in accordance with the use. That is, for example, the pixel 41 may be driven in the manner shown in FIG. 7.

Figure 7:
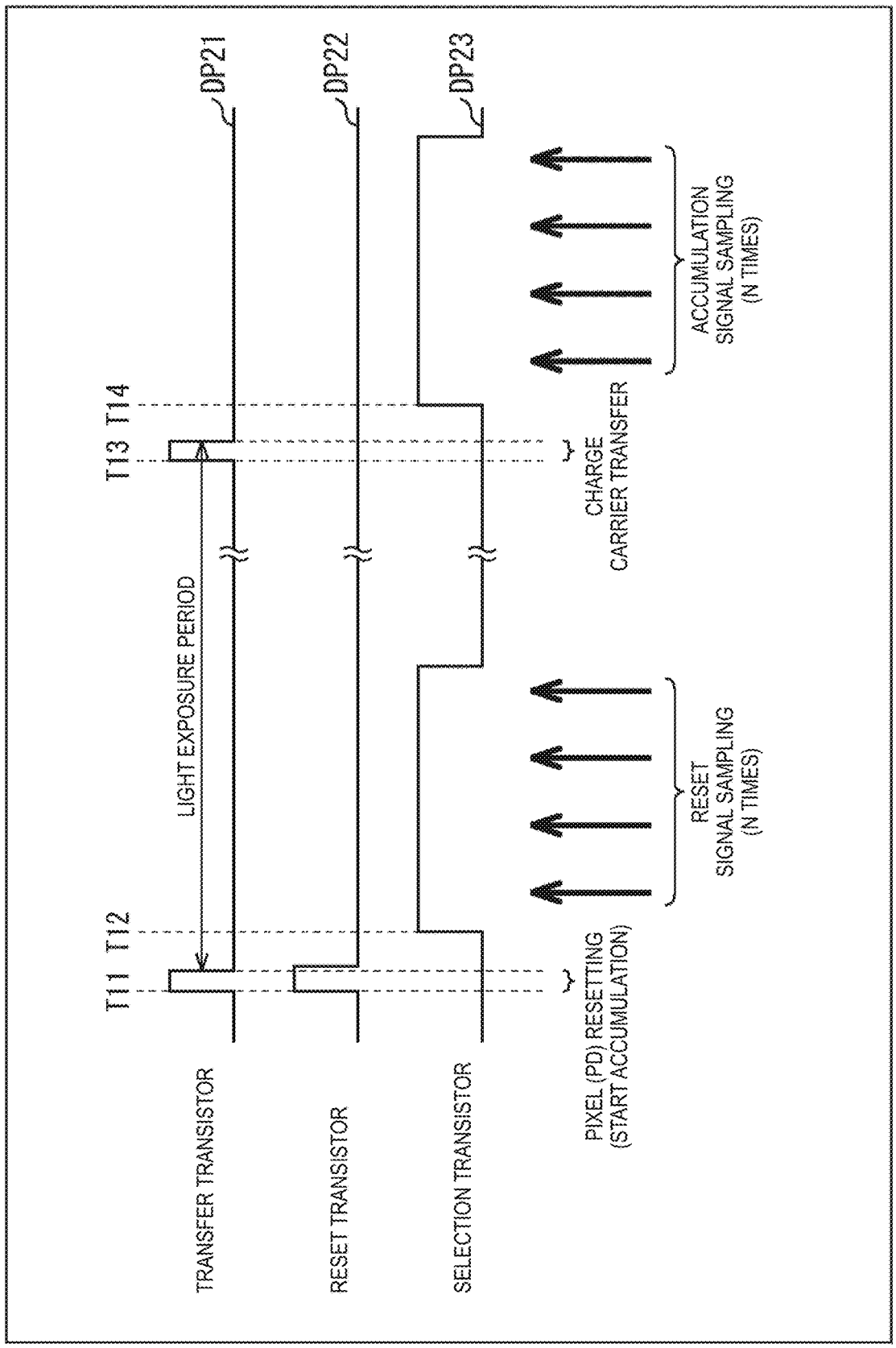
FIG. 7 is a diagram showing an example of driving of a pixel during radiation counting.

Note that, in FIG. 7, the horizontal direction represents time. Further, in FIG. 7, polygonal line DP21 to polygonal line DP23 represent the ON or OFF states of the transfer transistor 103, the reset transistor 105, and the selection transistor 107, respectively. In particular, the state where each of polygonal line DP21 to polygonal line DP23 is convex upward indicates the ON state, and the state where each of polygonal line DP21 to polygonal line DP23 is convex downward indicates the OFF state.

In the example shown in FIG. 7, the driving of the transfer transistor 103 is the same driving as the example shown in FIG. 6. Further, in the example shown in FIG. 7, also the driving of timing T11 is the same as the driving of timing T1 shown in FIG. 6, and PD resetting is performed at timing T11.

If at timing T11 PD resetting is performed and the transfer transistor 103 is switched off to start light exposure, the reset transistor 105 is controlled to the OFF state, and then the row driving circuit 111 controls the selection transistor 107 to the ON state at timing T12. Then, during the period up to the end of the light exposure period, the detection circuit 115 performs one or more times of sampling of a reset signal.

In the example shown in FIG. 6, as pre-processing of the readout operation, FD resetting is performed immediately before the end of the light exposure period, and then the sampling of reset signals is performed; on the other hand, in the example shown in FIG. 7, only the sampling of reset signals is performed in advance immediately after the start of the light exposure period. Further, on this occasion, FD resetting has been performed in association with the PD resetting.

The result of the sampling of reset signals performed after timing T11, that is, a digital signal Ds1 obtained in each round of sampling is temporarily held by the detection circuit 115.

If the sampling of reset signals ends, then the row driving circuit 111 controls the selection transistor 107 to the OFF state.

Further, if a light emission event is detected by the reception of a light emission pulse by the pixel 42, at timing T13 the row driving circuit 111 controls the transfer transistor 103 to the ON state to cause the transfer of charge carriers from the accumulation node 102 to the detection node 104 to start.

Then, after that, the row driving circuit 111 controls the transfer transistor 103 to the OFF state to cause the transfer of charge carriers to end; thereby, the light exposure period ends.

At timing T14, the row driving circuit 111 controls the selection transistor 107 to the ON state. Thereby, a signal in accordance with the voltage of the detection node 104 is supplied to the detection circuit 115 via the amplification transistor 106, the selection transistor 107, and the vertical signal line 114; thus, the detection circuit 115 performs one or more times of sampling of an accumulation signal. As a result, a digital signal Ds2 is obtained.

If the sampling of accumulation signals is performed, then the row driving circuit 111 controls the selection transistor 107 to the OFF state, and the readout of an output signal in one unit detection period from the pixel 41 ends.

An advantage of the driving shown in FIG. 7 in the above manner is that timing T11 and timing T13 of light exposure, and timing T12 and timing T14 of the sampling of signals are independent, and flexible timing setting becomes possible.

For example, also in a case where a plurality of pixels 41 are connected to one detection circuit 115, it is possible to introduce what is called a global shutter, in which the start and end of light exposure are simultaneously performed in all the pixels 41 all at once, and the readout of signals is sequentially performed on a pixel 41 basis.

Further, in the driving described with reference to FIG. 6, if the PD resetting at timing T1 is omitted and charge carrier release from the photodiode 101 associated with the charge carrier transfer at timing T3 at the time of readout is used also as PD resetting, the next light exposure period is started from immediately after this charge carrier release.

<Example 3 of Driving of Pixel for Measuring Amount of Light>

Further, in the driving described with reference to FIG. 7, pulse application to the transfer transistor 103, that is, the ON/OFF control of the transfer transistor 103 at timing T11 may be omitted, and only the detection node 104 may be reset. Thereby, a dead period in which photons incident on the pixel 41 are not sensed becomes almost zero.

Figure 8:
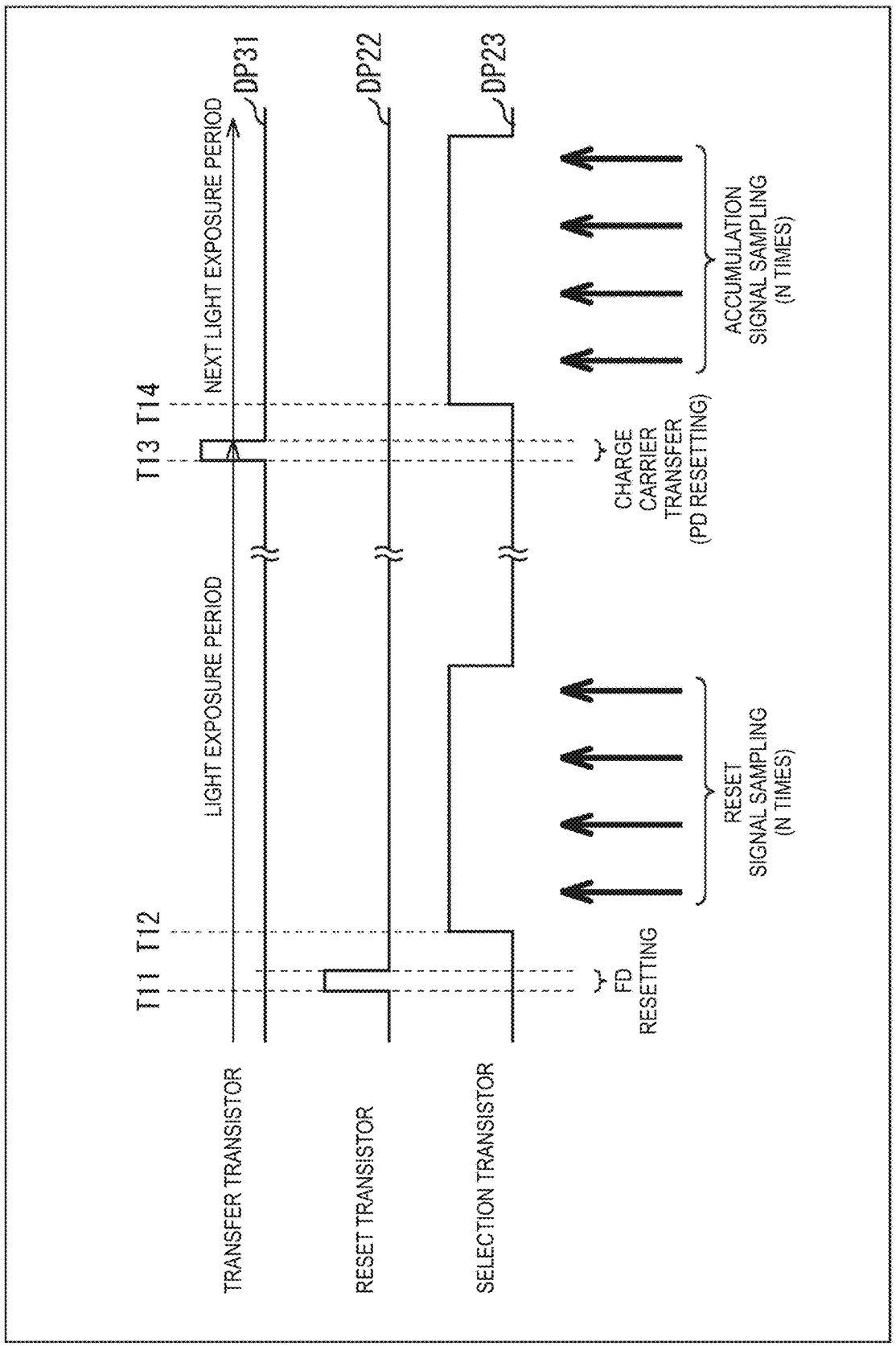
FIG. 8 is a diagram showing an example of driving of a pixel during radiation counting.

In such a case, the driving of the pixel 41 is as shown in FIG. 8. Note that, in FIG. 8, portions corresponding to those in the case of FIG. 7 are marked with the same reference numerals, and a description thereof is omitted as appropriate. Further, in FIG. 8, polygonal line DP31 represents the ON or OFF state of the transfer transistor 103.

In the example shown in FIG. 8, at timing T11 the transfer transistor 103 is not driven but kept in the OFF state, and only the reset transistor 105 is set to the ON state and then to the OFF state; thus, FD resetting is performed. Thereby, charge carriers accumulated in the photodiode 101 and the accumulation node 102 are held as they are, and only the detection node 104 is reset.

Then, at timing T12 the selection transistor 107 is controlled to the ON state, then the sampling of reset signals is performed, and after that the selection transistor 107 is controlled to the OFF state.

Further, at timing T13 the transfer transistor 103 is controlled to the ON state, and the transfer of charge carriers from the photodiode 101 and the accumulation node 102 to the detection node 104 is started. Then, after that, if the transfer transistor 103 is controlled to the OFF state, the light exposure period ends.

On this occasion, the transfer of charge carriers from the photodiode 101 and the accumulation node 102 to the detection node 104 serves as PD resetting at the same time, and the next round of charge carrier accumulation in the photodiode 101 is started. That is, at the same time as when the transfer transistor 103 is set to the OFF state and the light exposure period ends, the next light exposure period is started.

Therefore, in the driving shown in FIG. 8, the dead period of detection of the amount of light of a light emission pulse by the pixel 41 is zero. Further, the time of accumulation of charge carriers in the photodiode 101 (the light exposure period) is equal to the time of one unit detection period, that is, a time equivalent to one frame.

Further, the subsequent driving at and after timing T14 is similar driving to the example shown in FIG. 7.

<Configurational Example of Pixel Designed Specially for Light Emission Event Detection>

Next, a more detailed configuration of the pixel 42 for detecting the light emission of a light emission pulse is described.

Figure 9:
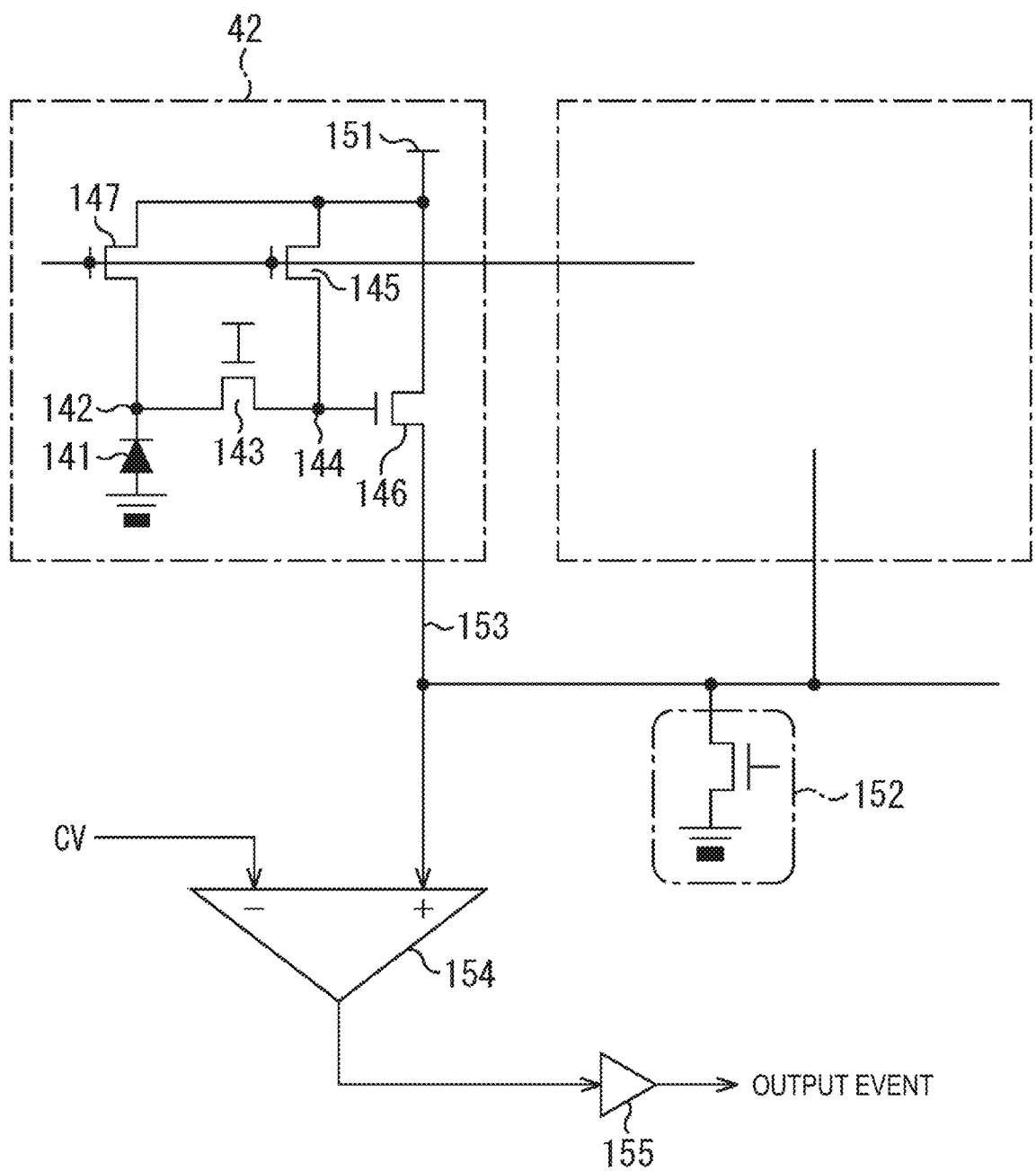
FIG. 9 is a diagram showing a configurational example of a pixel designed specially for light emission event detection.

The pixel 42 designed specially for light emission event detection to detect the generation of a light emission pulse, that is, a light emission event has the configuration shown in FIG. 9, for example.

That is, the pixel 42 includes a photodiode 141, an accumulation node 142, a transfer transistor 143, a detection node 144, a reset transistor 145, an amplification transistor 146, and a reset transistor 147.

In this example, in order to suppress the increase in the number of manufacturing processes as much as possible, a structure similar to the pixel 41 is employed as the structure of the pixel 42.

That is, the transfer transistor 143, the detection node 144, the amplification transistor 146, and the reset transistor 145 provided in the pixel 42 have the same size and the same structure as the transfer transistor 103, the detection node 104, the amplification transistor 106, and the reset transistor 105 of the pixel 41, respectively. Further, the photodiode 141 is designed as a non-multiplication-type photodiode.

The photodiode 141 receives and photoelectrically converts photons of a light emission pulse incident from the scintillator 31, and accumulates the resulting charge carriers (electrons) in the accumulation node 142.

In the pixel 42, the transfer transistor 143 and the reset transistor 147 are connected to the photodiode 141 via the accumulation node 142, and charge carriers accumulated in the accumulation node 142 are transferred to the detection node 144 by the transfer transistor 143.

The detection node 144 includes, for example, a floating diffusion layer; and accumulates charge carriers transferred from the transfer transistor 143, and generates an analog voltage in accordance with the amount of accumulated charge carriers.

The drain of the reset transistor 145 is connected to a power source 151, and the source is connected to the detection node 144. Further, the drain of the reset transistor 147 is connected to the power source 151, and the source is connected to the accumulation node 142. The reset transistor 145 and the reset transistor 147 are driven by, for example, the row driving circuit 111.

Further, the gate of the amplification transistor 146 is connected to the detection node 144, the drain is connected to the power source 151, and the source is connected to a vertical signal line 153. In the pixel 42, the amplification transistor 146 serves as a source follower together with a constant current circuit 152; and the charge (voltage) of the detection node 144 is amplified by the amplification transistor 146, and is outputted as a voltage signal to the vertical signal line 153.

However, the pixel 42 is designed specially for light emission event detection; hence, in the radiation counting apparatus 11, constant monitoring of the output of the pixel 42, that is, the vertical signal line 153 is necessary.

Thus, the transfer transistor 143 is constantly kept in the ON state; and charge carriers obtained by photoelectric conversion in the photodiode 141 are immediately transferred to the detection node 144, and are reflected in the output of the pixel 42.

Further, in the radiation counting apparatus 11, the vertical signal lines 153 of a plurality of pixels 42 are short-circuited, and thereby 1/f noise and thermal noise derived from the amplification transistors 146 are leveled and reduced.

Further, during the period of detection of a light emission event, the vertical signal line 153 is electrically connected to a comparator 154 all the time. Then, a signal outputted from the pixel 42 to the vertical signal line 153 and a comparative electric potential CV are compared by the comparator 154, and the comparison result is outputted as an event signal via an output amplifier 155.

Figure 10:
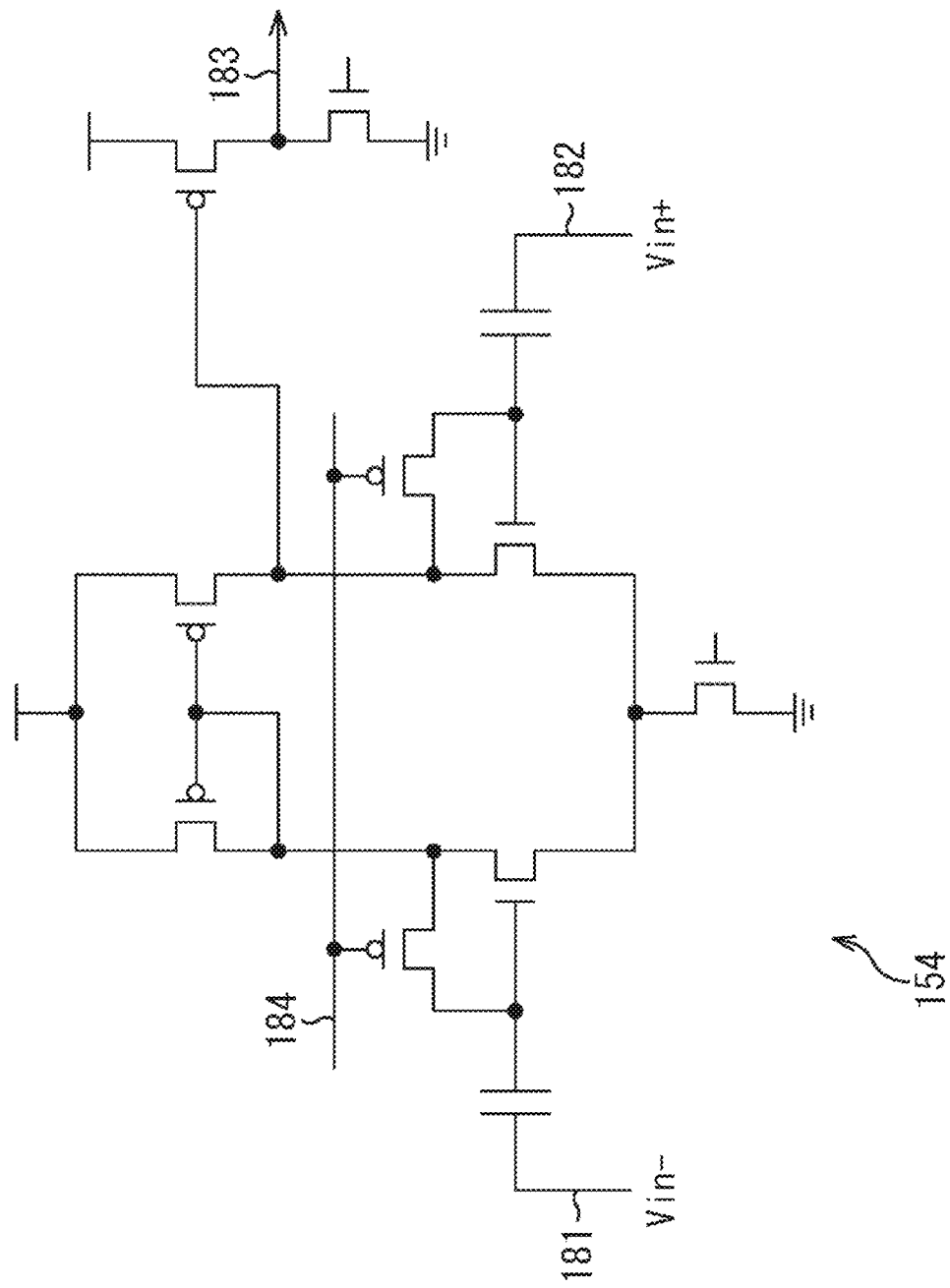
FIG. 10 is a diagram showing a configurational example of a comparator.

Further, the comparator 154 has the configuration shown in FIG. 10, for example.

The comparator 154 shown in FIG. 10 is a circuit of a common comparator; the electric potential of an input terminal 181 is set to the comparative electric potential CV, and the vertical signal line 153 is connected to an input terminal 182. Further, an output terminal 183 is connected to the output amplifier 155.

In such a comparator 154, auto-zero is performed by switching on the gate of a PMOS connected to a driving signal line 184; if auto-zero is performed, the output of the comparator 154 becomes an intermediate electric potential between upper and lower reference values with which comparison assessment is performed.

<Layout Example of Pixels in Light Receiving Surface>

Further, the photodiode 141 provided in the pixel 42 is expanded to, for example, twice the size of the photodiode 101 provided in the pixel 41. Accordingly, also the size of the pixel 42 is twice the size of the pixel 41, and pixels 42 are provided in the row direction with twice the pitch of pixels 41, for example.

This is in order to enhance the average amount of the signal per pixel with respect to a single round of pulse light emission, that is, the value of the output signal of the pixel 42.

In light emission event detection, the average value of the output signal of each pixel 42 and the comparative electric potential CV are compared by the comparator 154, and whether a light emission event, that is, the incidence of radiation has occurred or not is detected on the basis of the comparison result. Hence, the area of the light receiving portion of the pixel 42, that is, the light receiving surface of the photodiode 141 is set larger than the light receiving surface of the photodiode 101 of the pixel 41 so that, in a case where a light emission event has occurred, the value of each output signal is as large as possible.

In such a case, charge carriers unable to be transferred from the accumulation node 142 to the detection node 144 may be generated, but the reset transistor 147 is provided in the pixel 42 additionally so that those charge carriers are completely released by resetting.

Figure 11:
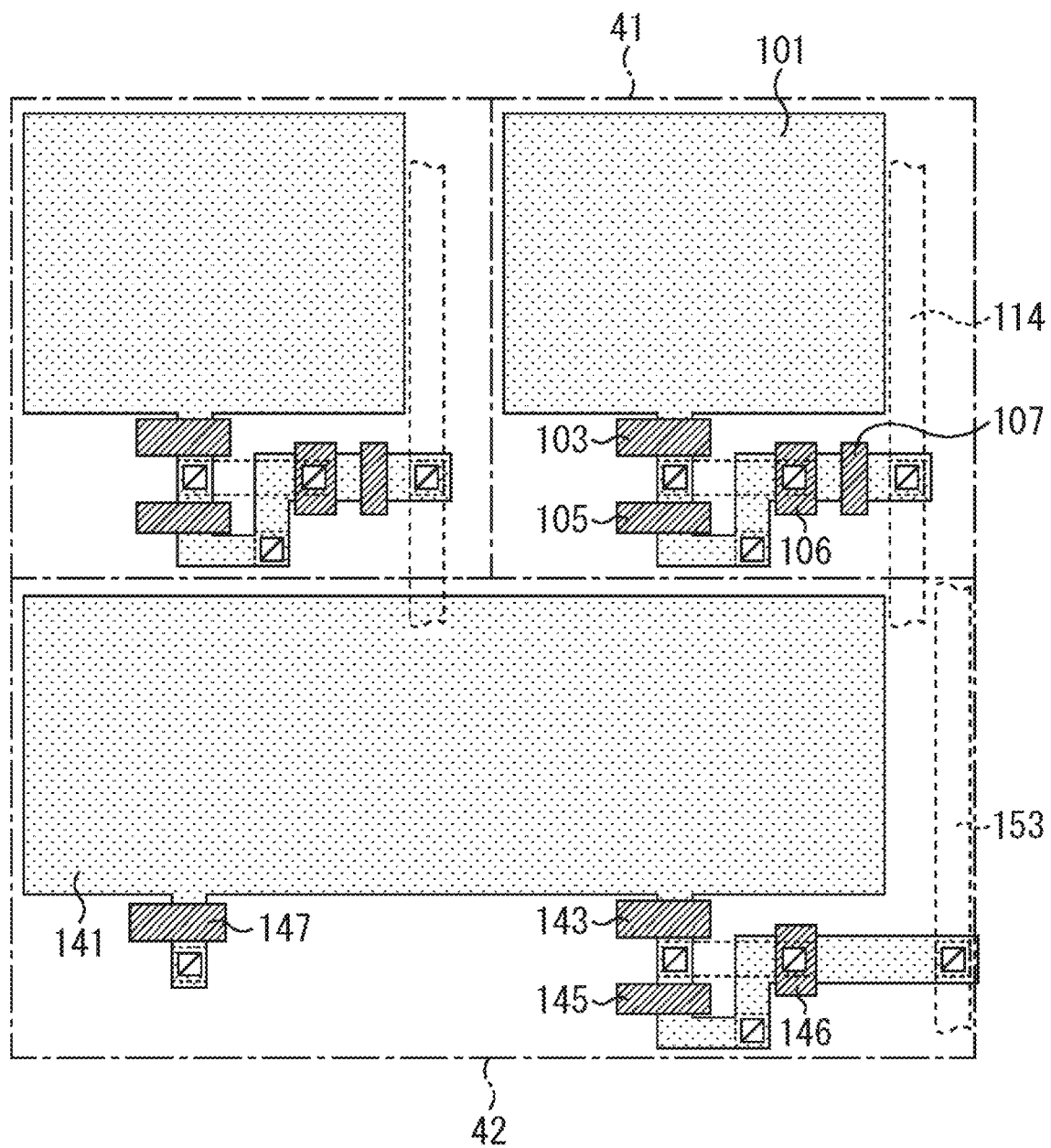
FIG. 11 is a diagram showing a layout example of pixels.

Here, a layout example of the pixel 41 and the pixel 42 on the light receiving surface of the light detector 33 is shown in FIG. 11. Note that, in FIG. 11, portions corresponding to those in the case of FIG. 5 or FIG. 9 are marked with the same reference numerals, and a description thereof is omitted as appropriate. Further, in FIG. 11, the horizontal direction represents the row direction, that is, the x direction in FIG. 2, and the vertical direction represents the column direction, that is, the y direction in FIG. 2.

In the example of FIG. 11, pixels 42 are provided in the row direction with twice the pitch of pixels 41, and the size of the photodiode 141 of the pixel 42 is a little more than twice the size of the photodiode 101 of the pixel 41.

Accordingly, in the pixel 42, a second reset transistor 147 is connected to the photodiode 141 in addition to the reset transistor 145 that is similar to the reset transistor of the pixel 41. Thereby, during resetting, the charge carriers of the whole photodiode 141 are released with reliability.

<Example of Driving of Pixel Designed Specially for Light Emission Event Detection>

Figure 12:
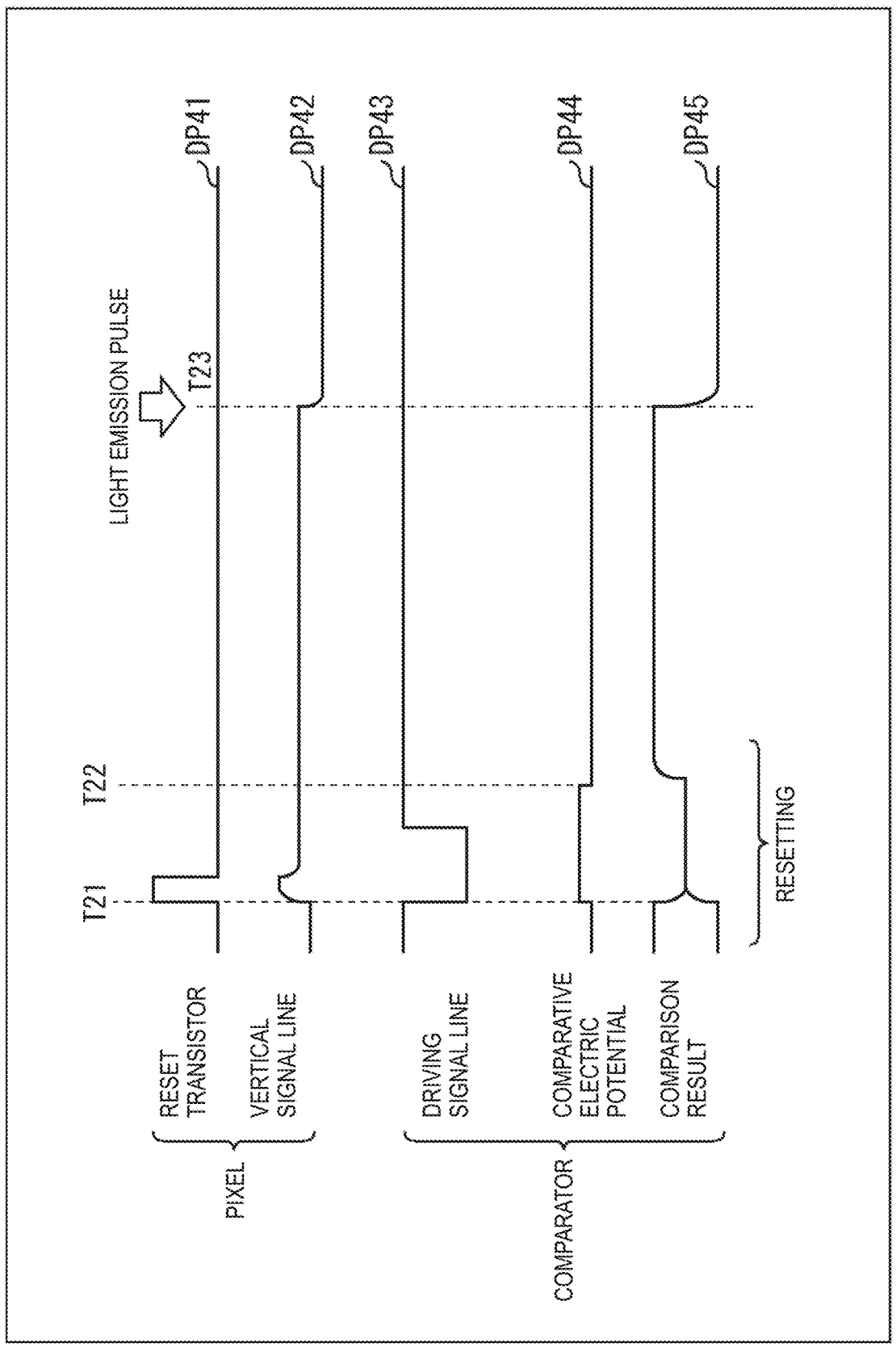
FIG. 12 is a diagram showing an example of driving of a pixel and a comparator during radiation counting.

Next, the driving of the pixel 42 and the comparator 154, that is, the operation of the pixel 42 and the comparator 154 during radiation counting is described. FIG. 12 is a timing chart showing an example of the driving of the pixel 42 and the comparator 154 during radiation counting.

Note that, in FIG. 12, the horizontal direction represents time. Further, in FIG. 12, polygonal line DP41 represents the ON or OFF states of the reset transistor 145 and the reset transistor 147. For polygonal line DP41, the state of being convex upward indicates being in the ON state, and the state of being convex downward indicates being in the OFF state.

Further, curved line DP42 represents the electric potential of the vertical signal line 153, and polygonal line DP43 represents the electric potential of the driving signal line 184, that is, the voltage level of a driving signal that is supplied to the comparator 154 by the driving signal line 184. Further, polygonal line DP44 represents the comparative electric potential CV, and curved line DP45 represents the electric potential (level) of a signal indicating the comparison result outputted from the comparator 154.

In the example of FIG. 12, the pixel 42 is reset periodically along with the pixel 41, and dark current accumulated between those rounds of resetting is released. That is, the operating process of the pixel 42 and the comparator 154 includes a resetting operation (resetting sequence) and the output of an event signal upon receiving a light emission pulse.

In the resetting operation, at timing T21, the row driving circuit 111 controls the reset transistor 145 and the reset transistor 147 provided in the pixel 42 to the ON state. Thereby, all the charge carriers of the photodiode 141 are released, and the electric potential of the detection node 144 is reset to the voltage of the power source 151. That is, the resetting of the photodiode 141 and the detection node 144 is performed. Here, the timing T21 of resetting is set to, for example, the same time as the timing T1 of resetting of the pixel 41 shown in FIG. 6.

Further, after timing T21, the row driving circuit 111 controls the reset transistor 145 and the reset transistor 147 to the OFF state, and removes the resetting of the photodiode 141 and the detection node 144.

If the reset transistor 145 is switched off, the detection node 144 undergoes coupling with the gate of the reset transistor 145 and stabilizes at a level slightly reduced from the voltage supplied by the power source 151, and the level is reflected in the vertical signal line 153 almost linearly.

On the other hand, in the comparator 154, at timing T21, a driving signal to be supplied to the gate of the PMOS via the driving signal line 184 is set to a low level (L-level), and thereby the gate of the PMOS becomes ON and auto-zero operation is performed.

By this auto-zero operation, the input terminal 181 and the input terminal 182 of the comparator 154 are short-circuited so that the electric potential of the vertical signal line 153 and the comparative electric potential CV enter a balance state.

Consequently, a signal that is outputted from the output terminal 183 of the comparator 154 to the output amplifier 155 and that indicates the comparison result in the comparator 154 has an intermediate electric potential between upper and lower reference values with which comparison assessment is performed. After that, a driving signal to be supplied to the gate of the PMOS via the driving signal line 184 is set to an H-level, and the auto-zero operation is completed.

Further, after the auto-zero operation is completed, at timing T22, a prescribed negative offset is added to the comparative electric potential CV, and the resetting of the pixel 42 and the comparator 154 is completed.

On this occasion, if at timing T22 a negative offset is added to the comparative electric potential CV, the output of the comparator 154, that is, a signal indicating the comparison result stabilizes at the H-level.

Note that the amount of the offset herein serves as a reference for assessing the presence or absence of light incidence, and needs to be appropriately set to such a level that false detection due to variations in characteristics and noise of the comparator and the pixel 42 designed specially for light emission event detection does not occur frequently and furthermore high sensitivity is obtained. To this end, a calibration circuit that cancels variations in characteristics or a mechanism that programs a level for each chip may be installed.

After that, if, for example at timing T23, photons of a light emission pulse are incident on the pixel 42 from the scintillator 31, the photoelectric conversion of the photons incident from the scintillator 31 is performed in the photodiode 141 of the pixel 42. Charge carriers obtained by photoelectric conversion in the photodiode 141 are immediately transferred to the detection node 144 via the accumulation node 142 and the transfer transistor 143.

Consequently, the electric potential of the detection node 144 drops by an amount equivalent to the charge carriers transferred to the detection node 144, and a voltage equivalent to this drop is amplified by the amplification transistor 146, and is outputted to the vertical signal line 153; thus, the level of the vertical signal line 153 decreases.

Then, if the average value of signals outputted from a plurality of pixels 42 that are short-circuited with vertical signal lines 153 becomes smaller than the comparative electric potential CV, that is, exceeds the offset added to the comparative electric potential CV, a signal that is an output of the comparator 154 and indicates the comparison result is reversed from the H-level to the L-level.

The comparison result is amplified by the output amplifier 155, and is outputted as an event signal. That is, in synchronization with the generation of a light emission pulse in the scintillator 31, an event signal indicating the generation of the light emission pulse is outputted from the output amplifier 155. Thus, in this example, an event signal that is outputted from the output amplifier 155 when the comparison result is an L-level signal serves as an event signal that indicates that a light emission event is detected.

<Another Configurational Example 1 of Pixel Designed Specially for Light Emission Event Detection>

Note that, in the above, an example in which a structure similar to the pixel 41 for measuring the amount of light is employed as the structure of the pixel 42 designed specially for light emission event detection in order to suppress the increase in the number of manufacturing processes of the light detector 33 is described. However, it is preferable that the pixel 42 emit a clear output in synchronization with pulse light, and ensure a high S/N ratio to random noise emitted by a pixel circuit and a peripheral circuit.

Figure 13:
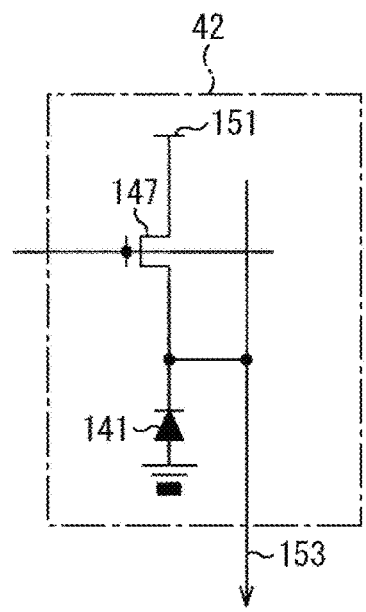
FIG. 13 is a diagram showing another configurational example of a pixel designed specially for light emission event detection.
Figure 14:
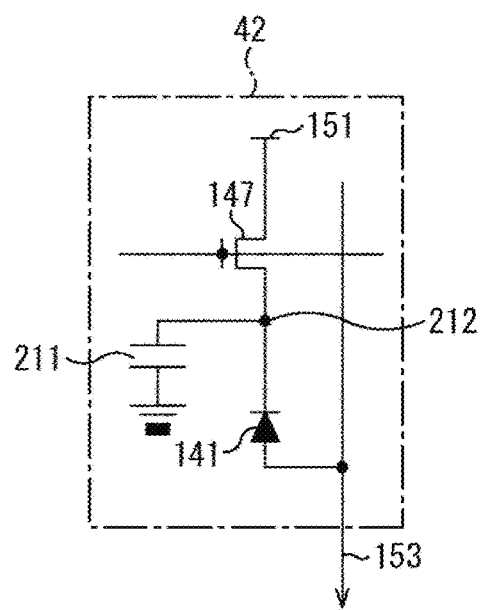
FIG. 14 is a diagram showing another configurational example of a pixel designed specially for light emission event detection.

An effective method for this is electron multiplication based on a high electric field in the interior of a photodiode, and the use of a multiplication-type photodiode such as an APD. That is, the pixel 42 is designed as a multiplication-type pixel. Further, on this occasion, if the multiplication factor is sufficiently high, also a configuration in which an amplification transistor is not provided in the pixel 42 is possible. Hereinbelow, a configurational example of the pixel 42 in such a case is shown in FIG. 13 and FIG. 14. Note that, in FIG. 13 and FIG. 14, portions corresponding to those in the case of FIG. 9 are marked with the same reference numerals, and a description thereof is omitted as appropriate.

In the example shown in FIG. 13, the pixel 42 includes the photodiode 141 and the reset transistor 147, and the photodiode 141 is designed as a multiplication-type photodiode such as an APD.

In this example, the reset transistor 147 is switched on and then switched off, and the pixel 42 is reset to a dark state. That is, the charge carriers of the photodiode 141 are released to the power source 151 via the reset transistor 147. On this occasion, the vertical signal line 153 is connected to the power source 151, and is kept in a floating state after the resetting.

Further, a high electric field is applied to the photodiode 141 by using an impurity profile of the photodiode 141 and the setting of the power source 151. If photons of a light emission pulse are incident on the photodiode 141 and a multiplied current flows through the photodiode 141, the level (electric potential) of the vertical signal line 153 decreases.

In a case where the vertical signal lines 153 of pixels 42 are short-circuited, the signal generated in the vertical signal line 153 is outputs of the pixels 42, that is, the sum total of signals in accordance with charge carriers obtained by the photodiodes 141 of the pixels 42. If a signal obtained by the vertical signal line 153 in this way and an appropriately set threshold (the comparative electric potential CV) are compared by the comparator 154, a light emission event output synchronized with the incidence of the light emission pulse, that is, an event signal can be obtained.

Note that, in a case where the multiplication factor of the photodiode is particularly high like in an APD that operates in the Geiger mode, the reset transistor 147 may be replaced with a high resistance element. In such a case, the pixel 42 fired with a light emission pulse is autonomously reset to a dark state after a lapse of a certain period of time.

<Another Configurational Example 2 of Pixel Designed Specially for Light Emission Event Detection>

Further, in the configurational example of the pixel 42 shown in FIG. 14, the pixel 42 includes the photodiode 141, the reset transistor 147, and a capacitance element 211, and the photodiode 141 is designed as a multiplication-type photodiode such as an APD.

In this example, the capacitance element 211 is added to a node 212 existing between the photodiode 141 and the reset transistor 147, and the vertical signal line 153 is connected to the anode side of the photodiode 141.

In the pixel 42, the reset transistor 147 is switched on and then switched off, and the pixel 42 is reset to a dark state; thereby, the capacitance element 211 is charged to the level of the power source 151. That is, charge carriers are accumulated in the capacitance element 211. On this occasion, the electric potential of the vertical signal line 153 has been set to, for example, around the ground level, and a high electric field is applied to the photodiode 141 to set the photodiode 141 to a multiplication operation in the Geiger mode.

If photons of a light emission pulse are incident on the photodiode 141 and the photodiode 141 comes into conduction, charge carriers charged in the capacitance element 211 flow into the vertical signal line 153, and a fixed signal is outputted for each pixel 42 regardless of the amount of light (photons) incident on the photodiode 141. That is, depending on the presence or absence of incidence of photons on each photodiode 141, a binary signal of 1 or 0 indicating this presence or absence is outputted from each pixel 42 to the vertical signal line 153.

In a case where the vertical signal lines 153 of pixels 42 are short-circuited, the signal generated in the vertical signal line 153 is in proportion to the total number of pixels 42 fired by light incidence. If a signal obtained by the vertical signal line 153 in this way and an appropriately set threshold (the comparative electric potential CV) are compared by the comparator 154, a light emission event output synchronized with the incidence of the light emission pulse, that is, an event signal can be obtained.

Note that, also in the pixel 42 shown in FIG. 14, the reset transistor 147 may be replaced with a high resistance element. In such a case, the pixel 42 fired with a light emission pulse is autonomously reset to a dark state after a lapse of a certain period of time.

Since the pixel 42 of a multiplication-type like the above uses a high electric field, a large area is occupied for the electrical isolation of each element, and it is difficult for the pixel 42 to ensure a high aperture ratio. However, on the other hand, a strong signal can be obtained as the output of the pixel 42 even by small photon incidence.

Usually the aperture ratio of the pixel directly leads to the accuracy of measurement of the amount of light; however, any pixel 42 designed specially for light emission event detection, like the above pixel 42, has no particular trouble. This is because the amount of light of a light emission pulse can be separately obtained with high accuracy by the pixel 41 of a non-amplification-type having a high aperture ratio.

<Configurational Example of Light Detector>

Next, a more specific configurational example of the light detector 33 described above is described with reference to FIG. 15. The light detector 33 has the configuration shown in FIG. 15, for example. Note that, in FIG. 15, portions corresponding to those in the case of FIG. 5 or FIG. 9 are marked with the same reference numerals, and a description thereof is omitted as appropriate.

Figure 15:
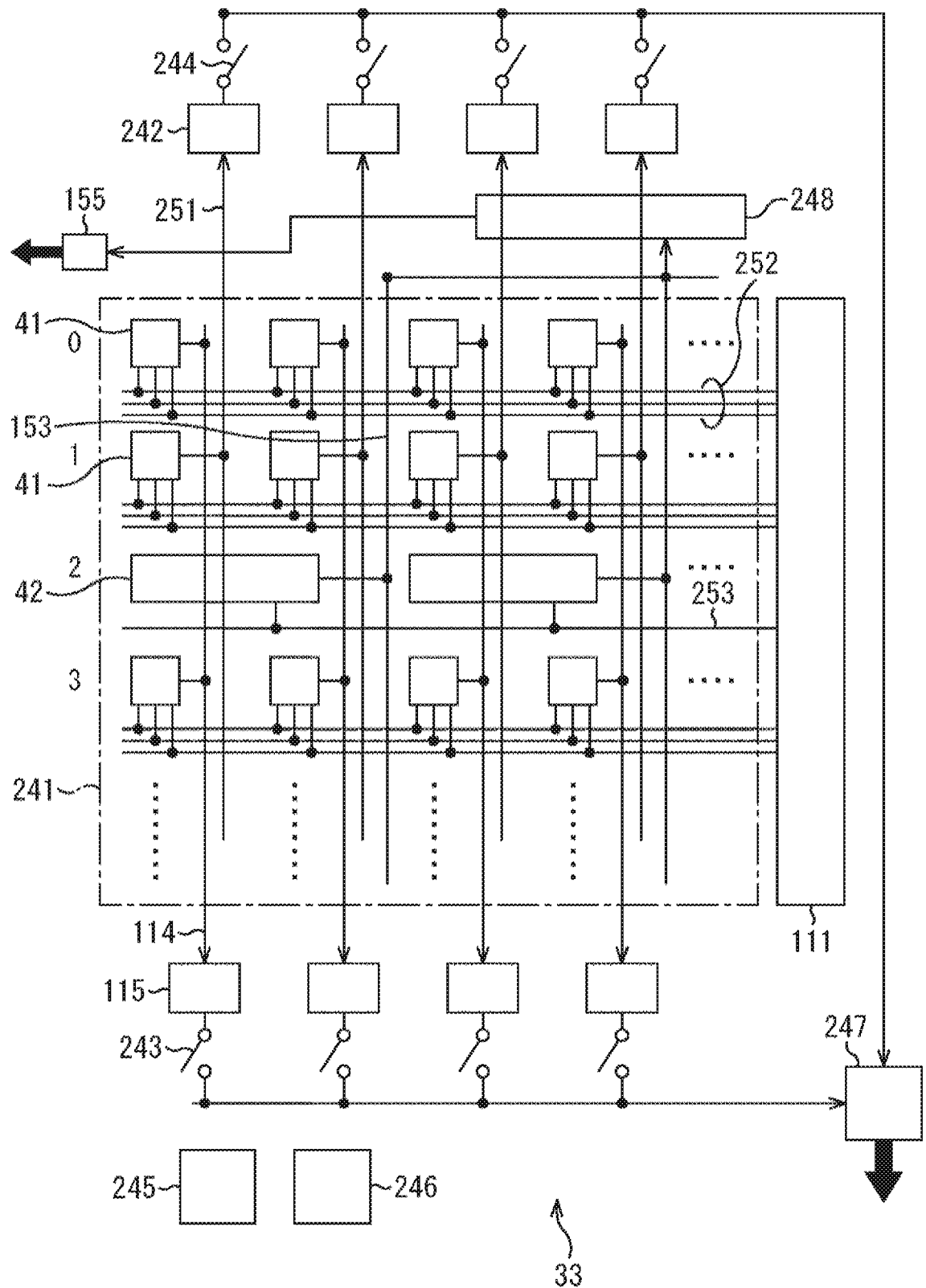
FIG. 15 is a diagram showing a configurational example of a light detector.

Note that, in this example, only some of a plurality of pixels 41 and a plurality of pixels 42 are marked with reference numerals, and in FIG. 15, the horizontal direction represents the row direction and the vertical direction represents the column direction. That is, a direction orthogonal to the row direction is the column direction.

The light detector 33 shown in FIG. 15 includes a pixel array section 241, detection circuits 115, detection circuits 242, switches 243, switches 244, a reference voltage generation circuit 245, a row driving circuit 111, a timing control circuit 246, an output circuit 247, an event detection circuit 248, and an output amplifier 155, and these circuits are provided on one chip.

In the pixel array section 241, a plurality of pixels 41 are provided in a two-dimensional lattice configuration. In the following, pixels arranged in the row direction may be referred to as a pixel row, and pixels arranged in the column direction may be referred to as a pixel column.

In this example, the detection circuit 115, the detection circuit 242, the switch 243, and the switch 244 are provided for each pixel column, and only some of the detection circuits and the switches are marked with reference numerals for easier viewing of the drawing.

In the pixel array section 241, a plurality of pixels 41 included in one pixel column are connected to one detection circuit 115, and similarly a plurality of pixels 41 included in one pixel column are connected to one detection circuit 242.

Further, in FIG. 15, in order to identify each pixel row, the numerical values of "0" to "3" indicating these pixel rows are written on the left side of the pixel row in the drawing; in the following, each pixel row is written using these numerical values as appropriate, for example written as the 0th row.

For example, the pixel 41 of the 0th row is connected to the detection circuit 115 via a vertical signal line 114, and the pixel 41 of the 1st row is connected to the detection circuit 242 via a vertical signal line 251 corresponding to the vertical signal line 114.

Further, each of the pixels 41 is connected to the row driving circuit 111 via a control line 252. More specifically, the control line 252 includes a plurality of control lines, and these control lines are connected to the gate of the transfer transistor 103, the gate of the reset transistor 105, and the gate of the selection transistor 107 of the pixel 41 shown in FIG. 5, respectively.

Further, in the pixel array section 241, a plurality of pixels 42 are provided to be arranged in the row direction. Each pixel 42 is connected to the event detection circuit 248 including the comparator 154 shown in FIG. 9, via a vertical signal line 153.

The output of the event detection circuit 248 is reduced in impedance by the output amplifier 155, and is outputted as an event signal. Further, each of the pixels 42 is connected to the row driving circuit 111 via a control line 253. In a case where, for example, the pixel 42 has the configuration shown in FIG. 9, the control line 253 is connected to the gate of the reset transistor 145 and the gate of the reset transistor 147 shown in FIG. 9.

The row driving circuit 111 controls each of the pixels 41 in accordance with control of the timing control circuit 246. The row driving circuit 111 PD-resets all the pixels 41 collectively, and causes a new round of light exposure and accumulation to start. This control corresponds to, for example, the control of timing T1 described with reference to FIG. 6.

Further, during readout, the row driving circuit 111 simultaneously selects two rows in the column direction, and causes an analog electrical signal to be outputted to each of the pixels 41 included in these rows. This electrical signal is read out by the detection circuit 115 and the detection circuit 242 and is converted to a digital signal, and an output signal of each pixel 41 is generated.

The two pixel rows selected on this occasion are, for example, pixel rows that are adjacent in the column direction and that include a pixel row including pixels 41 connected to the detection circuit 115 and a pixel row including pixels 41 connected to the detection circuit 242. This control corresponds to, for example, the control of from timing T2 to timing T4 described with reference to FIG. 6.

If the readout of the selected two rows is completed, the row driving circuit 111 selects the next two rows, and performs similar control. The reason why readout is performed sequentially in units of two rows in this way is that each detection circuit 115 and each detection circuit 242 are shared between a plurality of pixels 41 arranged in the column direction.

Further, the row driving circuit 111 performs the resetting of the pixel 42 in accordance with control of the timing control circuit 246.

If readout is completed for all the pixel rows including the pixel 41, image data equivalent to one frame, that is, one unit of pulse detection (one unit detection period) are outputted.

For example, in a case where 100 rows×100 columns of pixels 41 are provided in the pixel array section 241 and each piece of processing of two rows takes 16 microseconds (µs), the readout output of one frame requires 50 times of processing and takes approximately 0.8 milliseconds (ms) as a whole.

On this occasion, for example, the detection circuit 115 converts an electrical signal derived from the pixel 41 of the 0th row to a digital signal, and supplies the resulting digital signal to the output circuit 247 via the switch 243, in accordance with control of the timing control circuit 246.

On the other hand, the detection circuit 242 converts an electrical signal derived from the pixel 41 of the 1st row to a digital signal, and supplies the resulting digital signal to the output circuit 247 via the switch 244, in accordance with control of the timing control circuit 246.

More specifically, for example as described with reference to FIG. 6, each of the detection circuit 115 and the detection circuit 242 reads out an electrical signal from the pixel 41 and A/D-converts the signal, generates an output signal from the resulting digital signal, and supplies the output signal to the output circuit 247 via the switch 243 or the switch 244.

The switch 243 opens and closes the path between the corresponding detection circuit 115 and the output circuit 247. The switches 243 provided for the pixel columns become ON and OFF one after another in accordance with control of a column driving circuit (not illustrated) that selects the pixel columns one after another, and supply output signals supplied from the detection circuits 115, to the output circuit 247.

The switch 244 opens and closes the path between the corresponding detection circuit 242 and the output circuit 247. Similarly to the switches 243, also the switches 244 provided for the pixel columns become ON and OFF one after another in accordance with control of the column driving circuit, and supply output signals supplied from the detection circuits 242, to the output circuit 247.

The output circuit 247 outputs a digital signal to an image processing apparatus or the like. For example, the output circuit 247 calculates, from the output signals of the pixels 41 supplied from the switches 244 and the output signals of the pixels 41 supplied from the switches 243, the sum total of the values of the output signals of all the pixels 41 in one frame period (unit detection period), as an output synthetic value indicating the amount of light of the light emission pulse, and supplies the resulting value to the data processing section 22 via the signal line 43. This output synthetic value is a value indicating the amount of light of the light emission pulse that is incident on the pixel array section 241 from the scintillator 31.

The timing control circuit 246 controls the operating timing of the row driving circuit 111, the reference voltage generation circuit 245, the detection circuit 115, the detection circuit 242, and the event detection circuit 248.

For example, the timing control circuit 246 generates a timing control signal indicating the scanning timing of the pixel row, and supplies the timing control signal to the row driving circuit 111. Further, the timing control circuit 246 generates a digital-to-analog (DAC) control signal that controls the operation of supplying a reference voltage, and supplies the DAC control signal to the reference voltage generation circuit 245.

Furthermore, the timing control circuit 246 supplies a detection control signal that controls the operation of the detection circuit 115 and the detection circuit 242, to the detection circuit 115 and the detection circuit 242. In addition, the timing control circuit 246 performs the resetting of the event detection circuit 248 by a prescribed procedure.

The reference voltage generation circuit 245 generates a reference voltage Vref to be used for A/D conversion, in accordance with a DAC control signal, and supplies the reference voltage Vref to each of the detection circuits 115 and the detection circuits 242. Furthermore, the reference voltage generation circuit 245 supplies a comparative electric potential CV to the event detection circuit 248 in accordance with a second DAC control signal.

For example, in the example shown in FIG. 15, PD resetting is performed and then the light exposure of the pixel 41 is started in each unit detection period. Further, the output of the pixel 42 is monitored constantly by the event detection circuit 248, and a signal that is inputted from the vertical signal line 153 to the comparator 154 in the event detection circuit 248 in accordance with the output of the pixel 42, and the comparative electric potential CV are compared.

Then, the comparison result derived from the comparator 154 is amplified by the output amplifier 155 into an event signal, and the event signal is supplied to the data processing section 22 via the signal line 43.

The data processing section 22 detects a light emission event on the basis of the event signal derived from the output amplifier 155, and if a light emission event is detected, generates and holds a data object.

That is, if a light emission event is detected, the data processing section 22 generates a time stamp indicating the time of the generation of the light emission event and stores the time stamp in a data object, and instructs the light detector 33, more specifically, the timing control circuit 246 etc. of the light detector 33 to read out signals.

Consequently, each section of the light detector 33 performs the readout operation. On this occasion, the output circuit 247 calculates an output synthetic value in one unit detection period from output signals supplied from the switches 244 and output signals supplied from the switches 243, and supplies the output synthetic value to the data processing section 22. The data processing section 22 stores, in the data object, the output synthetic value supplied from the output circuit 247 in this way.

Note that, although herein it is described that the output circuit 247 calculates an output synthetic value from output signals of the pixels 41, the output synthetic value may be calculated by the data processing section 22. In such a case, the output circuit 247 supplies output signals of the pixels 41 to the data processing section 22.

Further, in the configurational example of the light detector 33 shown in FIG. 15, a plurality of pixels 41 are connected to the detection circuit 115 or the detection circuit 242, and each of these detection circuits is shared between the plurality of pixels 41. However, in a case where the size of the pixel 41 is increased and furthermore the light detector 33 has a stacked configuration like that described later, each of the detection circuits may be provided immediately below one pixel 41, and the pixel 41 and the detection circuit may be correlated in a one-to-one manner. In this case, for example, one frame is set to 16 μsec, and all the pixels 41 are collectively read out.

As described above, by the radiation counting apparatus 11 to which the present technology is applied, a radiation counting apparatus that can perform radiation counting accurately, is small in size and light in weight, is resistant to environmental variations, and can be stably driven with low voltage and low power consumption can be obtained. Furthermore, in the radiation counting apparatus 11, the pixel 42 designed specially for light emission event detection is provided in the light detector 33 separately from the pixel 41 for measuring the amount of light; thus, also a sufficient time resolution can be ensured during radiation detection. Therefore, the radiation counting apparatus 11 can be used also for a nuclear medical diagnosis apparatus that performs coincidence counting, such as a PET, for example.

Second Embodiment

<Configurational Example of Radiation Counting Apparatus>

Further, in the first embodiment, one scintillator 31 is correlated to the light detector 33, and scintillation light is diffused over the entire surface of the opening section of the light detector 33. On the other hand, it is also possible to ensure a space resolution on a detection surface (light receiving surface) by correlating a scintillator array to a similar light detector.

Figure 16:
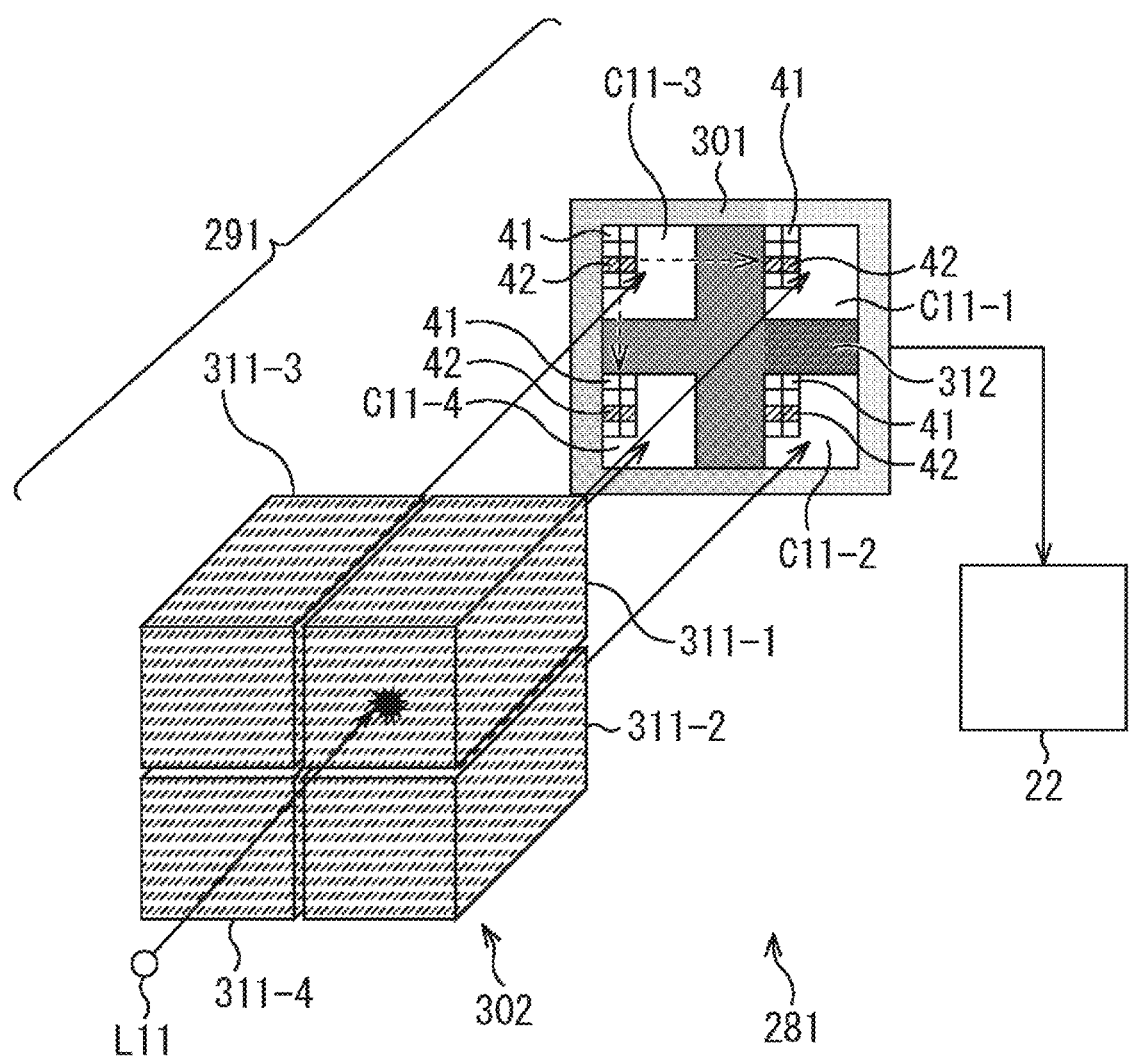
FIG. 16 is a diagram showing another configurational example of a radiation counting apparatus.

In such a case, the radiation counting apparatus has the configuration shown in FIG. 16, for example. Note that, in FIG. 16, portions corresponding to those in the case of FIG. 1 are marked with the same reference numerals, and a description thereof is omitted as appropriate.

A radiation counting apparatus 281 shown in FIG. 16 includes a light receiving section 291 and the data processing section 22. Further, the light receiving section 291 includes a light detector 301 and a scintillator array 302.

The scintillator array 302 includes four scintillator sections 311-1 to 311-4 that are optically separated from each other by a not-illustrated separating wall, and each scintillator section corresponds to the scintillator 31 shown in FIG. 1. Note that, hereinafter, in a case where there is no need to particularly distinguish the scintillator section 311-1 to the scintillator section 311-4, they may be referred to as simply a scintillator section 311.

The light detector 301 corresponds to the light detector 33 of FIG. 1, and the opening section, that is, the light receiving surface of the light detector 301 is separated into four regions C11-1 to C11-4 so as to correspond to the divided scintillator sections 311. Note that, hereinafter, in a case where there is no need to particularly distinguish region C11-1 to region C11-4, they may be referred to as simply region C11.

Pixels 41 and pixels 42 are provided in each region C11, and the amount of light of a light emission pulse generated in each scintillator section 311 is measured by using the pixels 41 in region C11 corresponding to the scintillator section 311. That is, in this example, the measurement of the amount of light is performed for each region C11.

Further, pixels 42 are provided in each region C11, and also the detection of the timing of generation of a light emission pulse, that is, the detection of a light emission event is performed for each region C11.

If a light emission event occurs in any one of region C11-1 to region C11-4, the readout operation is performed selectively on the pixel 41 in region C11 that is the area where the light emission event has occurred, and an output synthetic value indicating the amount of light of the light emission pulse is calculated. Then, a data object including the output synthetic value and a time stamp is recorded.

Note that, in this example, the resetting of the pixel 41 and the pixel 42 may be performed collectively in the pixels 41 and the pixels 42 of all regions C11.

Further, in the light detector 301, region C11-1 to region C11-4 provided on the light receiving surface are separated by a light blocking section 312, and thereby the leaking-in of light from a not-corresponding scintillator section 311 is prevented.

By employing such a configuration, for example, photons of a light emission pulse generated by gamma rays that are incident on the scintillator section 311-1 reach only the pixel array section in the corresponding region C11-1. Thereby, it becomes possible to provide one light detector 301 with a space resolution; furthermore, a gamma camera or a PET with an improved space resolution can be obtained by tiling the light detector 301 and the scintillator array 302.

Note that, although herein an example in which the light receiving surface of the light detector 301 is divided into regions C11 by the light blocking section 312 is described, the light blocking section 312 may not necessarily be provided.

Third Embodiment

<Configurational Example of Light Detector>

Further, the light detector 33 shown in FIG. 1 and the light detector 301 shown in FIG. 16 may have a stacked configuration. For example, in a case where the light detector 33 has a stacked configuration, the light detector 33 has the configuration shown in FIG. 17. Note that, in FIG. 17, portions corresponding to those in the case of FIG. 15 are marked with the same reference numerals, and a description thereof is omitted as appropriate.

Figure 17:
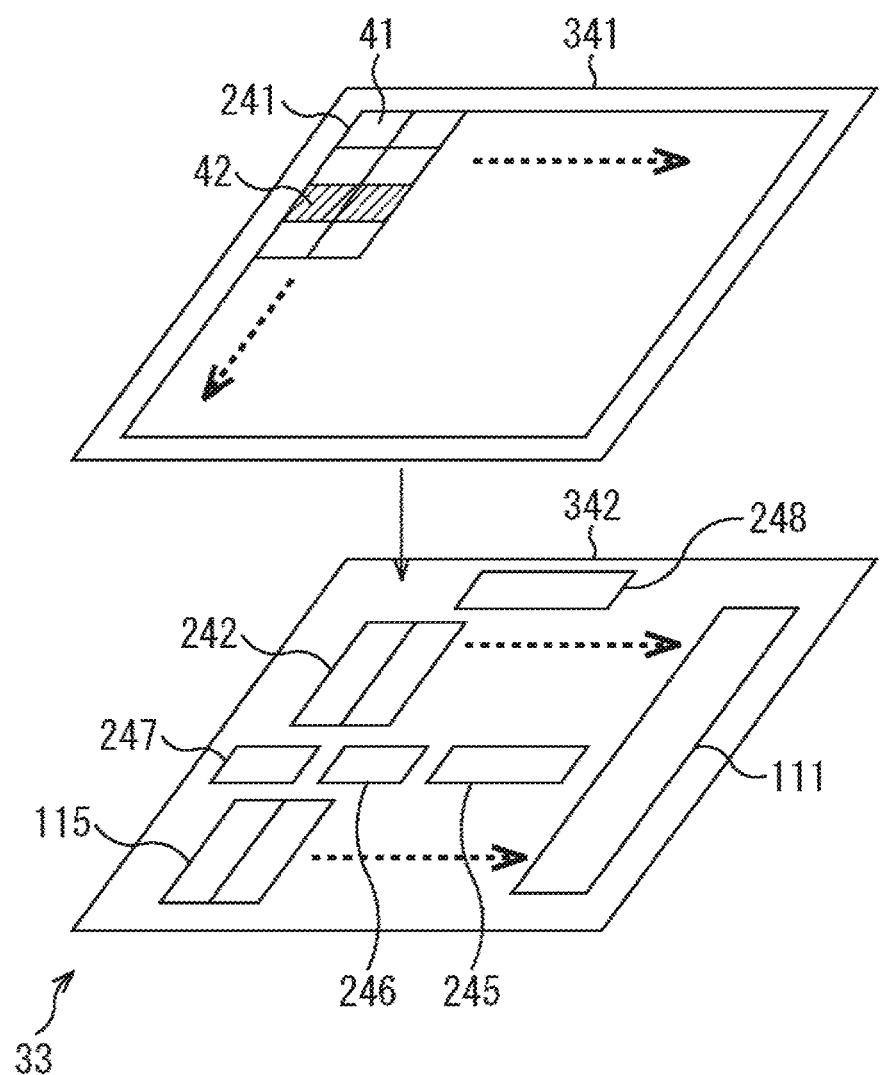
FIG. 17 is a diagram showing another configurational example of a light detector.

The light detector 33 shown in FIG. 17 includes one chip obtained by stacking an upper-side substrate 341 and a lower-side substrate 342.

The pixel array section 241 is provided in the upper-side substrate 341, and pixels 41 and pixels 42 are provided to be arranged in the pixel array section 241, as described with reference to FIG. 15.

Further, the detection circuit 115, the detection circuit 242, the event detection circuit 248, the row driving circuit 111, the reference voltage generation circuit 245, the timing control circuit 246, the output circuit 247, etc. are provided in the lower-side substrate 342. Note that, although herein only some of the detection circuits 115 and the detection circuits 242 are marked with reference numerals, a plurality of detection circuits 115 and a plurality of detection circuits 242 are provided in the lower-side substrate 342.

The upper-side substrate 341 and the lower-side substrate 342 are stacked by silicon stacking technology such as adhesion of silicon wafers, for example.

In this example, the scintillator 31 is located on the upper-side in the drawing with respect to the pixel 41 and the pixel 42 of the pixel array section 241, and photons of a light emission pulse are incident on the pixel 41 and the pixel 42 from the upper side in the drawing. Thus, the lower-side substrate 342 in which each circuit is provided is stacked on the opposite side to the light incidence side of the pixel array section 241; thereby, the light receiving surface, that is, the aperture ratio of each pixel of the pixel array section 241 can be improved.

As a result, even if a large-sized scintillator 31 is connected to the light detector 33 in order to increase radiation sensitivity, most of the light emission pulses generated in the scintillator 31 can be received.

In particular, in a case where tiling is performed in the manner of the example shown in FIG. 16, that is, in a case where the light receiving surface is divided into several regions and radiation counting is performed independently in each region, the yield of light emission pulses can be improved. Also in the use example shown in FIG. 17, minimizing the fringe section other than the opening section including the pixel 41 and the pixel 42 enables tiling in an uniform opening, while narrowing the width of a light blocking section corresponding to the light blocking section 312 of FIG. 16.

The quantum efficiency of such a large-sized semiconductor pixel is nearly 100%, and therefore the energy resolution is equivalent to a photomultiplier in many uses. Further, semiconductor light detectors can be mass-produced in the same manufacturing line as and by a similar manufacturing process to CMOS image sensors on the market.

The radiation counting apparatus 11 including the light detector 33 thus manufactured is small in size and light in weight, is resistant to environmental variations, has stable characteristics, and is easy to maintain. Further, the output of the light detector 33 is a digital signal; thus, the circuit required in later stages may be only a circuit of processing of digital signals, and not only is the output less susceptible to noise from the surroundings, but also data outputted from a large number of light receiving sections can be easily processed.

By providing the pixel 41 and the pixel 42, and circuits such as the detection circuit 115 and the detection circuit 242 in different substrates and stacking the substrates in the above manner, the ratio of the area of the pixel array section 241 in the light receiving surface of the light detector 33 (aperture ratio) can be increased, and the energy resolution can be improved.

Fourth Embodiment

<With Regard to Example of Application to Flow Cytometry>

Meanwhile, the light detector 33 to which the present technology is applied can also be used for other fields than radiation counting. For example, flow cytometry is given as an example of acquisition of a feeble fluorescence pulse or the like by the light detector 33 in other fields than radiation counting.

Hereinbelow, an example in which the present technology is applied to flow cytometry is described with reference to FIG. 18. Note that, in FIG. 18, portions corresponding to those in the case of FIG. 1 are marked with the same reference numerals, and a description thereof is omitted as appropriate.

Figure 18:
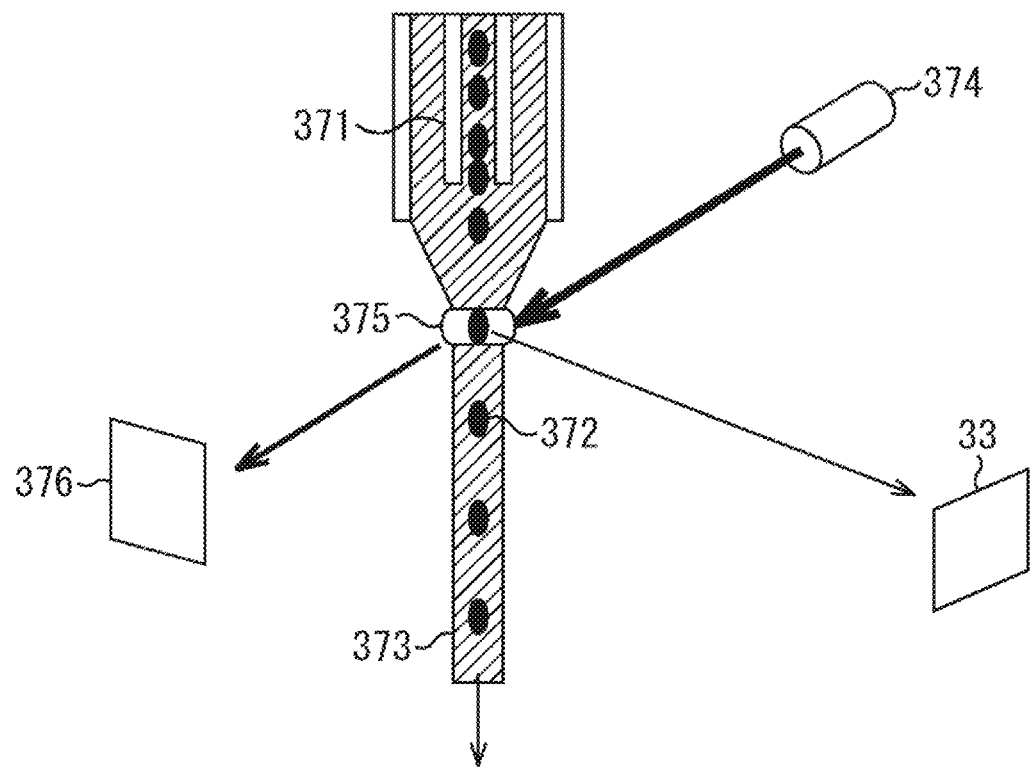
FIG. 18 is a diagram describing an example in which the present technology is applied to flow cytometry.

In the example shown in FIG. 18, test samples 372 such as cells passed from a sample tube 371 are arranged in a line in a sample flow 373, and this place is irradiated with laser light emitted from a light source 374. If a test sample 372 passes through an irradiation spot 375 of laser light, scattered light and fluorescence excited from a fluorescence marker or the like are generated.

Then, front scattered light, which has a larger amount of light, is received by a photodiode 376, and the size of the test sample 372 is detected.

On the other hand, side scattered light or fluorescence emitted by a fluorescence marker attached to the test sample 372 becomes feeble pulse light, and is sensed by the light detector 33 functioning as a pulse light detector. Information regarding the type and internal structure of the test sample 372 is acquired by the fluorescence and the side scattered light.

Figure 19:
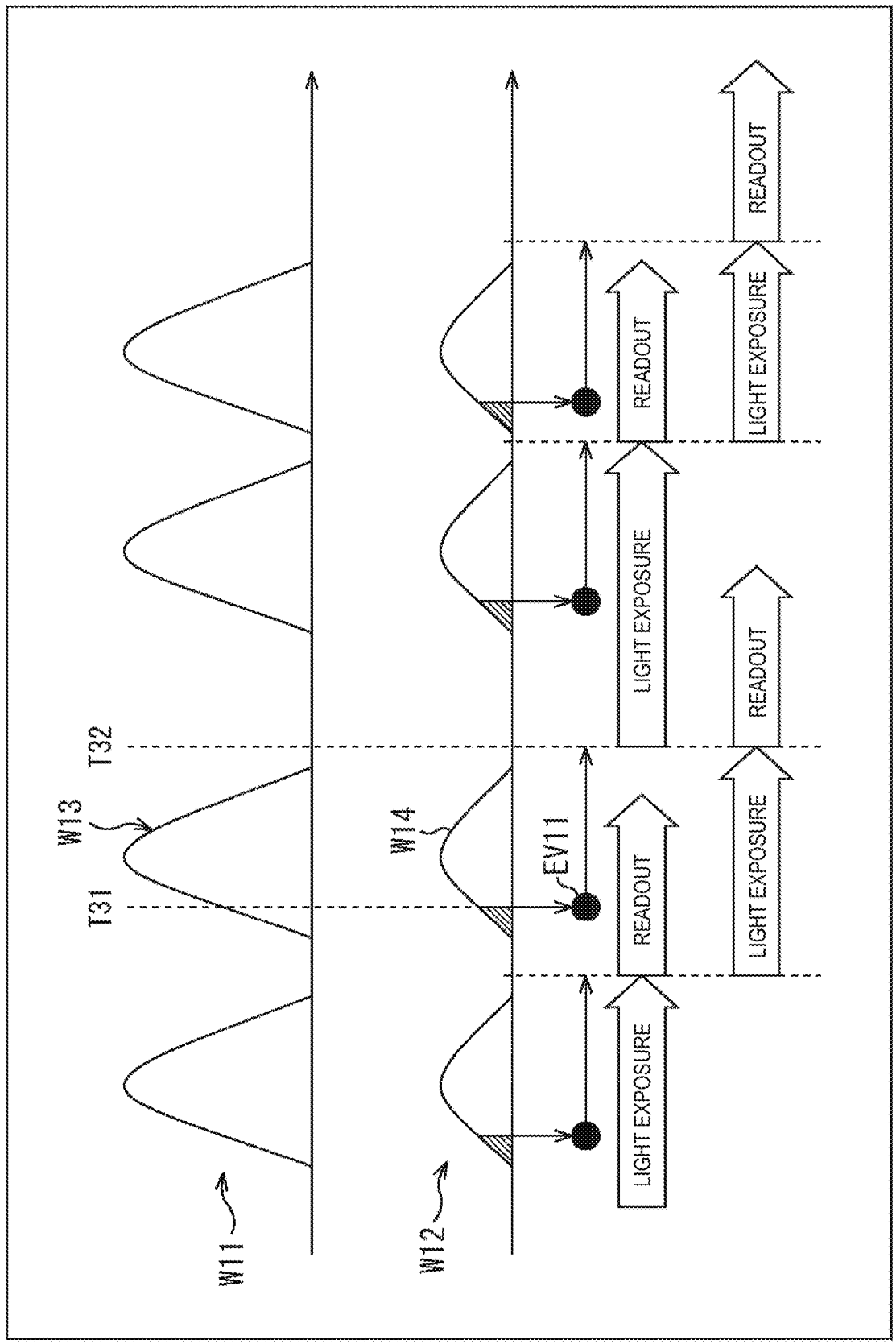
FIG. 19 is a diagram describing event detection, light exposure, and readout.

Here, a manner of feeble pulse detection is shown in FIG. 19. Note that, in FIG. 19, the horizontal direction represents the time direction. Further, the curved line indicated by arrow W11 represents the intensity of light that is incident on the light detector 33 from the test sample 372, that is, side scattered light or fluorescence at each time. Furthermore, the curved line indicated by arrow W12 represents the intensity of light that is incident on one pixel 42 of the light detector 33 from the test sample 372, that is, side scattered light or fluorescence at each time.

In association with the passage of a test sample 372 through the irradiation spot 375 of laser light, the intensity of side scattered light or fluorescence has a pulse shape like the portion indicated by arrow W13 of the curved line indicated by arrow W11. Each pulse portion of the curved line indicated by arrow W11 corresponds to the passage of one test sample 372 through the irradiation spot 375.

From an integrated signal of pulse light W14 that is incident on the pixel 42 and is included in side scattered light or fluorescence of the portion indicated by arrow W13, the pixel 42 designed specially for light emission event detection included in the light detector 33 outputs an event signal EV11 almost synchronized with the timing of passage of the test sample 372, at timing T31.

Here, the completion of light exposure of the pixel 41 for measuring the amount of light and the readout of an output in the light detector 33 are performed in synchronization with the event signal associated with the passage of the test sample 372 through the irradiation spot 375.

Specifically, the light detector 33 performs the driving described with reference to FIG. 8, that is, global shutter driving in which there is practically no dead period of side scattered light or fluorescence.

On this occasion, charge carrier transfer in the pixel 41 is performed in synchronization with the event signal EV11 of test sample passage, and the light exposure period ends and readout is started. Further, the next light exposure period is started in all the pixels 41 all at once.

That is, at timing T32 at which a certain delay that takes the flow velocity and size of the test sample 372 into consideration has elapsed after the event signal EV11 is acquired, the light detector 33 completes light exposure (accumulation) in each pixel 41 for measuring the amount of light, and starts the readout of accumulation signals from the pixel 41.

Here, timing T32 corresponds to timing T13 in FIG. 8. The light exposure period is caused to end after a certain period of time from when the event signal EV11 is acquired, that is, from when the light emission event is detected, and thereby it becomes possible to receive, with the pixel 41, light emitted from the test sample 372, that is, all the light of the portion indicated by arrow W13.

Further, on starting the readout of accumulation signals, the light detector 33 starts the next round of light exposure (accumulation) of the pixel 41. Note that the readout (sampling) of reset signals may be performed during the period from when the immediately preceding readout of accumulation signals ends and before the light exposure period ends.

An output synthetic value that is the total value of outputs of the pixels 41, that is, the sum total of output signals of the pixels 41 in each readout sequence is equivalent to the total amount of photons received by the light detector 33 for each piece of pulse light that is side scattered light or fluorescence. Thereby, the intensity of side scattered light or fluorescence for each test sample 372 is derived.

Note that, in a case where, like in a flow cytometer, test samples flow almost continuously and light pulses are generated continuously at intervals of, although fluctuating, less than or equal to 100 μsec, there is little room for the periodic resetting shown in FIG. 4 to occur. Thus, periodic resetting of the pixel may be omitted from the sequence of detection.

Also in a case where the present technology is used for fluorescence detection in flow cytometry or the like in the above manner, the apparatus can be downsized, and furthermore stable operation resistant to environmental variations can be achieved. Further, a sufficient time resolution for light emission event detection can be ensured.

Fifth Embodiment

<Configurational Example of Light Detector>

Meanwhile, the method for arranging pixels used for light emission event detection has various variations; for example, a pixel for light emission event detection such as the pixel 42 may be provided separately from a pixel array including pixels for measuring the amount of light such as the pixel 41 described above, independently around the pixel array.

Further, a pixel normally used to measure the amount of light may be used to be switched to a pixel for event detection by a switch mechanism. In such a case, the light detector 33 has the configuration shown in FIG. 20, for example. Note that, in FIG. 20, portions corresponding to those in the case of FIG. 15 are marked with the same reference numerals, and a description thereof is omitted as appropriate.

Figure 20:
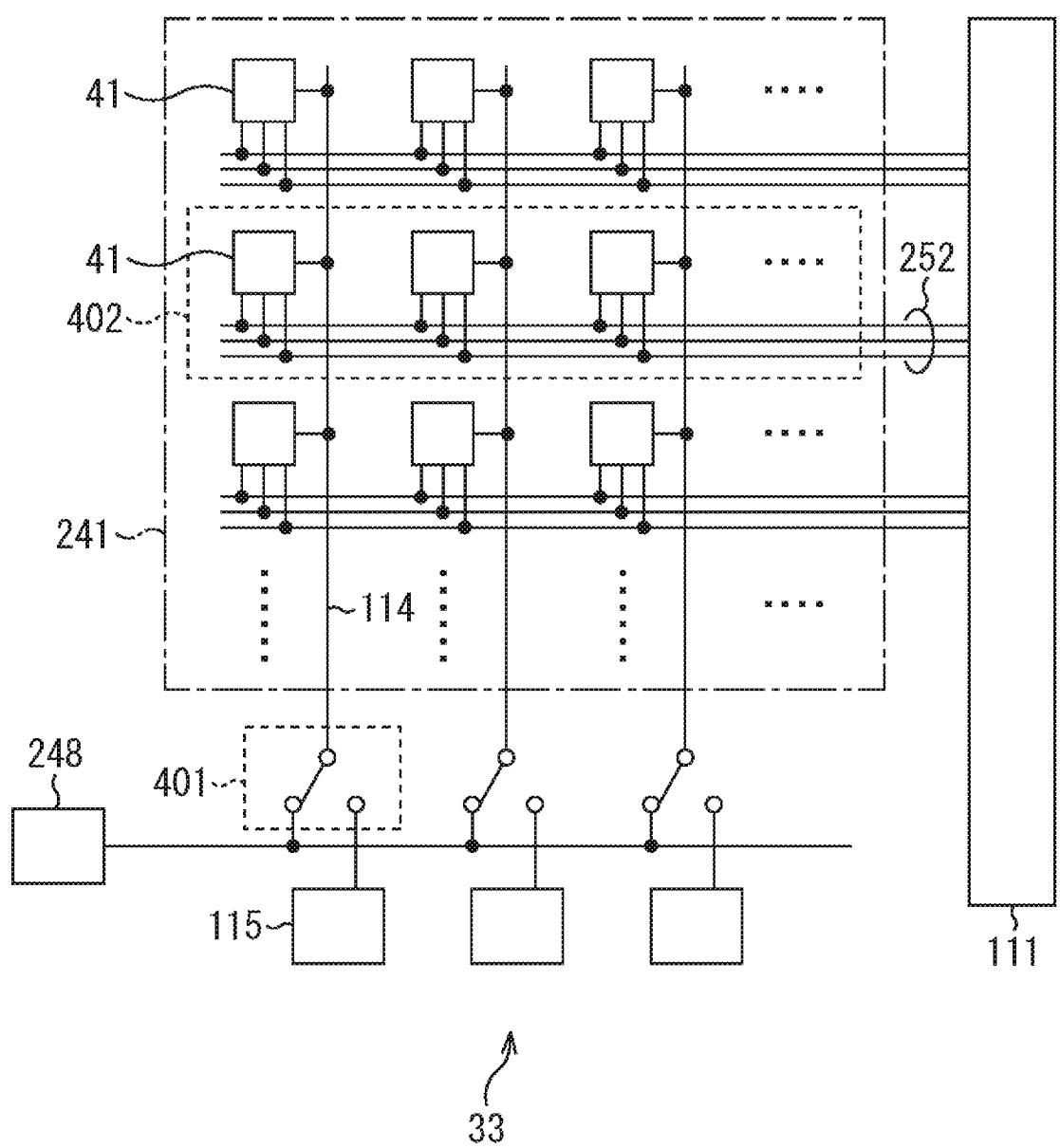
FIG. 20 is a diagram showing a configurational example of a light detector.

In the light detector 33 shown in FIG. 20, a plurality of pixels 41 are arranged as an array in the row direction and the column direction in the pixel array section 241, and a plurality of pixels 41 arranged in the column direction are connected to one vertical signal line 114. Note that each of these pixels 41 has, for example, the circuit configuration shown in FIG. 5.

An input terminal of a switch 401 is connected to the vertical signal line 114, and the switch 401 switches its output destination to either one of the detection circuit 115 and the event detection circuit 248, as necessary. That is, an input terminal of the switch 401 is connected to the vertical signal line 114, the detection circuit 115 is connected to one output terminal of the switch 401, and the event detection circuit 248 is connected to another output terminal of the switch 401.

For example, in a case where there is no need to monitor a light emission event, that is, in a case where there is no need to perform the detection of a light emission event, the switch 401 is fixed to remain connected to the output terminal on the detection circuit 115 side, and an output of the pixel 41 is supplied to the detection circuit 115 via the vertical signal line 114 and the switch 401. Then, the readout of accumulated charge carriers from the pixel 41 is performed periodically on a pixel row basis by the detection circuit 115.

On the other hand, in a case where it is intended to perform readout after detecting light incidence, that is, in a case where the monitoring of a light emission event is performed, a switching operation of the switch 401 like below is performed.

In this case, for example, a light emission event is detected by one pixel row 402 including pixels 41. That is, the pixel 41 included in the pixel row 402 functions as a pixel for light emission event detection.

First, the photodiodes 101 of the pixels 41 are reset all at once; while the presence or absence of incidence of a light emission pulse is monitored, all the pixels 41 included in a specific pixel row 402 are selected as a pixel used for light emission event detection all the time. That is, the transfer transistor 103 and the selection transistor 107 of each pixel 41 of the pixel row 402 are controlled to the ON state by the row driving circuit 111.

Further, simultaneously with this, the switch 401 is connected to the output terminal on the event detection circuit 248 side, and an output of each pixel 41 of the pixel row 402 is supplied to a comparator for event monitoring, that is, the event detection circuit 248 via the vertical signal line 114 and the switch 401. Then, the outputs of these pixels 41 are continuously monitored by the event detection circuit 248.

If a light emission event is detected by the event detection circuit 248, the light detector 33 controls the switch 401 so that the switch 401 is connected to the output terminal on the detection circuit 115 side, and that an output of each pixel 41 is supplied to the detection circuit 115 via the vertical signal line 114 and the switch 401.

Then, the row driving circuit 111 sequentially selects all the other pixel rows than the pixel row 402 that has been used for the detection of a light emission event, and causes outputs from the pixels 41 of these pixel rows set to a selection state to be supplied to the detection circuit 115.

The detection circuit 115 A/D-converts a signal read out from each pixel 41, and supplies, to a not-illustrated output circuit 247, the resulting digital output signal indicating the amount of light of photons incident on the pixel 41. Further, the output circuit 247 calculates an output synthetic value indicating the amount of light of the light emission pulse, on the basis of the output signal of each pixel 41 supplied from the detection circuit 115.

An advantage of the configuration of such a light detector 33 shown in FIG. 20 is that the same chip can be used for both normal imaging and light emission event detection in accordance with the use.

Furthermore, there is also an advantage that a pixel 41 in a desired place can be used as a pixel for light emission event detection by the selection of the switch 401 and the row driving circuit 111. Thereby, it is also possible to perform the detection of a light emission event while avoiding a defective pixel with a very large dark current; thus, there is also an advantage that false detection of a light emission event due to a defective pixel can be reduced.

Note that the embodiment of the present technology is not limited to the embodiments described above, and various alterations are possible without departing from the spirit of the present technology.

Additionally, the present technology may also be configured as below.

(1)
An imaging element including:
a pixel array section including
a plurality of first pixels each including
a first photoelectric conversion section configured to photoelectrically convert incident light,
a floating diffusion section configured to generate a voltage in accordance with an amount of charge carriers obtained by the photoelectric conversion, and
a transfer section configured to transfer the charge carriers from the first photoelectric conversion section to the floating diffusion section, and
a second pixel configured to detect incidence of light,
in which readout of a signal is performed intermittently from each of the plurality of first pixels in accordance with the voltage, and
an output of the second pixel is monitored continuously.

(2)
The imaging element according to (1), further including:
an event detection section configured to output a signal synchronized with incidence of light on the second pixel, on a basis of the output of the second pixel.

(3)
The imaging element according to (2), further including:
a driving section configured to control readout of a signal from the first pixel in accordance with an output of a signal from the event detection section.

(4)
The imaging element according to (3),
in which the driving section controls the transfer section in accordance with an output of a signal from the event detection section to cause the charge carriers obtained by the photoelectric conversion to be transferred to the floating diffusion section, and controls readout of a signal from the first pixel.

(5)
The imaging element according to any one of (1) to (4), further including:
a detection section configured to generate a digital signal indicating an amount of light incident on the first pixel, on a basis of a signal read out from the first pixel.

(6)
The imaging element according to (5), further including:
an output section configured to calculate an amount of light incident on the pixel array section, on a basis of the digital signal obtained for each of the plurality of first pixels.

(7)
The imaging element according to (5) or (6),
in which the first pixel further includes
a first amplification section configured to output a signal in accordance with the voltage generated by the floating diffusion section, and
a selection section configured to enter a conduction state or a non-conduction state in accordance with control and, on entering the conduction state, output a signal outputted from the first amplification section, to the detection section.

(8)
The imaging element according to any one of (1) to (7),
in which the second pixel includes
a second photoelectric conversion section configured to photoelectrically convert incident light, and
a second amplification section configured to output a signal in accordance with charge carriers obtained by the photoelectric conversion by the second photoelectric conversion section.

(9)
The imaging element according to any one of (1) to (7), in which the first pixel is a non-multiplication-type pixel, and the second pixel is a multiplication-type pixel.
(10)
The imaging element according to any one of (1) to (9), in which a light receiving surface of the second pixel is larger than a light receiving surface of the first pixel.
(11)
A driving method for driving an imaging element, the imaging element including
a pixel array section including
a plurality of first pixels each including
a photoelectric conversion section configured to photoelectrically convert incident light,
a floating diffusion section configured to generate a voltage in accordance with an amount of charge carriers obtained by the photoelectric conversion, and
a transfer section configured to transfer the charge carriers from the photoelectric conversion section to the floating diffusion section, and
a second pixel configured to detect incidence of light,
the driving method including:
a step of continuously monitoring an output of the second pixel and detecting incidence of light on the second pixel on a basis of the output of the second pixel; and
a step of resetting the first pixel periodically, and controlling readout of a signal according to the voltage from the first pixel, in accordance with detection of incidence of light on the second pixel.
(12)
An electronic device including:
a pixel array section including
a plurality of first pixels each including
a photoelectric conversion section configured to photoelectrically convert incident light,
a floating diffusion section configured to generate a voltage in accordance with an amount of charge carriers obtained by the photoelectric conversion, and
a transfer section configured to transfer the charge carriers from the photoelectric conversion section to the floating diffusion section,
a second pixel configured to detect incidence of light,
in which readout of a signal is performed intermittently from each of the plurality of first pixels in accordance with the voltage, and
an output of the second pixel is monitored continuously.

REFERENCE SIGNS LIST 11 radiation counting apparatus
21 light receiving section
22 data processing section
31 scintillator
33 light detector
41 pixel
42 pixel
101 photodiode
103 transfer transistor
104 detection node
106 amplification transistor
111 row driving circuit
115 detection circuit
141 photodiode
146 amplification transistor
154 comparator

The invention claimed is:
1. An imaging element comprising:
a pixel array including
a plurality of first pixels each including
a first photoelectric converter that photoelectrically converts incident light via a first photodiode,
a first floating diffusion region that generates a voltage in accordance with an amount of charge carriers obtained by photoelectric conversion in the first photoelectric converter, and
a first transfer device that transfers the charge carriers from the first photoelectric converter to the first floating diffusion region when switched to an ON state, and
a second pixel that detects an incidence of light via a second photodiode, the second pixel including
a second photoelectric converter that photoelectrically converts incident light via a second photodiode,
a second floating diffusion region that generates a voltage in accordance with an amount of charge carriers obtained by photoelectric conversion in the second photoelectric converter, and
a second transfer device that transfers the charge carriers from the second photoelectric converter to the second floating diffusion region,
wherein the first pixels are reset periodically at a prescribed periodic timing unit, and the first pixels begin accumulation of charge carriers for a new timing unit according to a reset operation of a previous timing unit,
wherein readout of a signal is performed intermittently from each of the first pixels in accordance with the voltage, the readout starting based on a signal synchronized with the incidence of the light detected by the second pixel,
wherein a surface area of the second photodiode is greater than a surface area of the first photodiode,
wherein the second pixel is arranged between two of the first pixels, and
wherein the second transfer device is continuously in an ON state such that an output of the second pixel is monitored continuously.
2. The imaging element according to claim 1, further comprising:
an event detector that outputs the signal synchronized with the incidence of light on the second pixel, based on the output of the second pixel.
3. The imaging element according to claim 2, further comprising:
a driving circuit that controls the readout of the signal from each of the first pixels in accordance with the signal output from the event detector.
4. The imaging element according to claim 3, wherein the driving circuit controls the first transfer device in accordance with the signal output from the event detector to cause the charge carriers obtained by the photoelectric conversion to be transferred to the first floating diffusion region, and controls the readout of the signal from each of the first pixels.
5. The imaging element according to claim 1, further comprising:
for each of the first pixels, a detector that generates a digital signal indicating an amount of light incident on the first pixel, based on the signal read out from the first pixel.

6. The imaging element according to claim 5, further comprising:
an output circuit that calculates an amount of light incident on the pixel array, based on the digital signal obtained for each of the first pixels.

7. The imaging element according to claim 5, wherein each of the first pixels further includes
a first amplifier that outputs a signal in accordance with the voltage generated by the first floating diffusion region, and
a selection device that enters a conduction state or a non-conduction state in accordance with a control and, on entering the conduction state, outputs a signal outputted from the first amplifier to the detector.

8. The imaging element according to claim 1, wherein the second pixel includes a second amplifier that outputs a signal in accordance with charge carriers obtained by photoelectric conversion in the second photoelectric converter.

9. The imaging element according to claim 1, wherein each of the first pixels is a non-multiplication-type pixel, and the second pixel is a multiplication-type pixel.

10. The imaging element according to claim 1, wherein the surface area of the second photodiode is more than twice larger than the surface area of the first photodiode.

11. A driving method for driving an imaging element including a pixel array that includes a plurality of first pixels each including a first photoelectric converter that photoelectrically converts incident light via a first photodiode, a first floating diffusion region that generates a voltage in accordance with an amount of charge carriers obtained by photoelectric conversion in the first photoelectric converter, and a first transfer device that transfers the charge carriers from the first photoelectric converter to the first floating diffusion region, and that includes a second pixel including a second photoelectric converter that photoelectrically converts incident light via a second photodiode, a second floating diffusion region that generates a voltage in accordance with an amount of charge carriers obtained by photoelectric conversion in the second photoelectric converter, and a second transfer device that transfers the charge carriers from the second photoelectric converter to the second floating diffusion region, wherein a surface area of the second photodiode is greater than a surface area of the first photodiode, and wherein the second pixel is arranged between two of the first pixels, the driving method comprising:
causing the second transfer device to be continuously in an ON state to enable an output of the second pixel to be monitored continuously;
detecting an incidence of light on the second pixel based on the output of the second pixel; and
for each of the first pixels:
resetting the first pixel periodically at a prescribed periodic timing unit,
allowing accumulation of charge carriers to begin for a new timing unit according to a reset operation of a previous timing unit,
controlling the first transfer device to switch to an ON state to transfer the charge carriers to the floating diffusion region, and
controlling readout of a signal from the first pixel according to the voltage, in accordance with a detection of an incidence of light on the second pixel, wherein the readout starts based on a signal synchronized with the incidence of the light on the second pixel.

12. An electronic device comprising:
a pixel array including
a plurality of first pixels each including
a first photoelectric converter that photoelectrically converts incident light via a first photodiode,
a first floating diffusion region that generates a voltage in accordance with an amount of charge carriers obtained by photoelectric conversion in first the photoelectric converter, and
a first transfer device that transfers the charge carriers from the first photoelectric converter to the first floating diffusion region when controlled to be in an ON state, and
a second pixel that detects an incidence of light via a second photodiode, the second pixel including
a second photoelectric converter that photoelectrically converts incident light via a second photodiode,
a second floating diffusion region that generates a voltage in accordance with an amount of charge carriers obtained by photoelectric conversion in the second photoelectric converter, and
a second transfer device that transfers the charge carriers from the second photoelectric converter to the second floating diffusion region,
wherein the first pixels are reset periodically at a prescribed periodic timing unit, and the first pixels begin accumulation of charge carriers for a new timing unit according to a reset operation of a previous timing unit,
wherein readout of a signal is performed intermittently from each of the first pixels in accordance with the voltage, the readout starting based on a signal synchronized with the incidence of the light detected by the second pixel,
wherein a surface area of the second photodiode is greater than a surface area of the first photodiode,
wherein the second pixel is arranged between two of the first pixels, and
wherein the second transfer device is continuously in an ON state such that an output of the second pixel is monitored continuously.

* * * * *